United States Patent
Larson, III et al.

(10) Patent No.: US 7,173,504 B2
(45) Date of Patent: Feb. 6, 2007

(54) IMPEDANCE TRANSFORMATION RATIO CONTROL IN FILM ACOUSTICALLY-COUPLED TRANSFORMERS

(75) Inventors: John D. Larson, III, Palo Alto, CA (US); Naghmeh Sarkeshik, Cupertino, CA (US); Stephen L. Ellis, Pleasanton, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 107 days.

(21) Appl. No.: 10/965,474

(22) Filed: Oct. 13, 2004

(65) Prior Publication Data

US 2005/0128030 A1 Jun. 16, 2005

Related U.S. Application Data

(63) Continuation-in-part of application No. 10/699,481, filed on Oct. 30, 2003, now Pat. No. 6,946,928.

(51) Int. Cl.
*H03H 9/54* (2006.01)
*H03H 9/60* (2006.01)
(52) U.S. Cl. .................. 333/189; 333/192; 333/32
(58) Field of Classification Search ........ 333/187–189, 333/133
See application file for complete search history.

(56) References Cited

U.S. PATENT DOCUMENTS

| | | | |
|---|---|---|---|
| 5,587,620 A | 12/1996 | Ruby et al. ............... 310/346 |
| 5,864,261 A | 1/1999 | Weber .................... 333/187 |
| 5,873,154 A | 2/1999 | Ylilammi et al. | |
| 6,107,721 A | 8/2000 | Lakin .................... 310/321 |
| 6,215,375 B1 | 4/2001 | Larson, III et al. ...... 333/187 |
| 6,262,637 B1 | 7/2001 | Bradley et al. ........... 333/133 |
| 6,278,342 B1 | 8/2001 | Ella | |
| 6,466,105 B1 | 10/2002 | Lobl et al. | |
| 6,670,866 B2 | 12/2003 | Ellaet et al. ............ 333/133 |
| 6,720,844 B1* | 4/2004 | Lakin .................... 333/189 |
| 6,900,705 B2 | 5/2005 | Nakamura et al. | |
| 6,946,928 B2* | 9/2005 | Larson et al. ........... 333/189 |
| 2003/0128081 A1 | 7/2003 | Ella et al. .............. 333/133 |

OTHER PUBLICATIONS

Lakin, K.M., "Bulk Acoustic Wave Coupled Resonator Filters", IEEE International Frequency Control Symposium and PDA Exhibition, 2002, pp. 8-14.

\* cited by examiner

*Primary Examiner*—Barbara Summons

(57) ABSTRACT

The film acoustically-coupled transformer (FACT) has decoupled stacked bulk acoustic resonators (DSBARs), a first electrical circuit and a second electrical circuit. Each of the DSBARs has a lower film bulk acoustic resonator (FBAR), an upper FBAR and an acoustic decoupler. The upper FBAR is stacked on the lower FBAR and the acoustic decoupler is located between the FBARs. Each FBAR has opposed planar electrodes and a piezoelectric element between the electrodes. The first electrical circuit interconnects the lower FBARs. The second electrical circuit interconnects the upper FBARs. The FBARs of one of the DSBARs differ in electrical impedance from the FBARs of another of the DSBARs. The FACT has an impedance transformation ratio greater than $1:m^2$, where m is the number of DSBARs. The actual impedance transformation ratio depends on the ratio of the impedances of the FBARs.

27 Claims, 15 Drawing Sheets

IMPEDANCE TRANSFORMATION RATIO CONTROL IN FILM ACOUSTICALLY-COUPLED TRANSFORMERS

RELATED APPLICATION

This disclosure is a Continuation-in-Part of U.S. patent application Ser. No. 10/699,481, now U.S. Pat. No. 6,946,928, of John D. Larson III and Richard Ruby. This application is also related to U.S. patent application Ser. No. 10/,965,586 of John D. Larson III and Richard Ruby entitled *Film Acoustically-Coupled Transformer With Increased Common Mode Rejection*, U.S. patent application Ser. No. 10/965,449 of John D. Larson III and Stephen Ellis entitled *Pass Bandwidth Control in Decoupled Stacked Bulk Acoustic Resonator Devices*, and U.S. patent application Ser. No. 10/965,637 of John D. Larson III, Richard Ruby and Stephen Ellis entitled *Film Acoustically-Coupled Transformer*, all filed on the filing date of this application. The above applications are all assigned to the assignee of this application and the disclosures of the above applications are incorporated into this application by reference.

BACKGROUND

Transformers are used in many types of electronic device to perform such functions as transforming impedances, linking single-ended circuitry with balanced circuitry or vice versa and providing electrical isolation. However, not all transformers have all of these properties. For example, an autotransformer does not provide electrical isolation.

Transformers operating at audio and radio frequencies up to VHF are commonly built as coupled primary and secondary windings around a high permeability core. Current in the windings generates a magnetic flux. The core contains the magnetic flux and increases the coupling between the windings. A transformer operable in this frequency range can also be realized using an optical-coupler. An opto-coupler used in this mode is referred to in the art as an opto-isolator.

In transformers based on coupled windings or opto-couplers, the input electrical signal is converted to a different form (i.e., a magnetic flux or photons) that interacts with an appropriate transforming structure (i.e., another winding or a light detector), and is re-constituted as an electrical signal at the output. For example, an opto-coupler converts an input electrical signal to photons using a light-emitting diode. The photons pass through an optical fiber or free space that provides isolation. A photodiode illuminated by the photons generates an output electrical signal from the photon stream. The output electrical signal is a replica of the input electrical signal.

At UHF and microwave frequencies, coil-based transformers become impractical due to such factors as losses in the core, losses in the windings, capacitance between the windings, and a difficulty to make them small enough to prevent wavelength-related problems. Transformers for such frequencies are based on quarter-wavelength transmission lines, e.g., Marchand type, series input/parallel output connected lines, etc. Transformers also exist that are based on micro-machined coupled coils sets and are small enough that wavelength effects are unimportant. However such transformers have issues with high insertion loss and low primary to secondary isolation and low primary to secondary isolation.

All the transformers just described for use at UHF and microwave frequencies have dimensions that make them less desirable for use in modern miniature, high-density applications such as cellular telephones. Such transformers also tend to be high in cost because they are not capable of being manufactured by a batch process and because they are essentially an off-chip solution. Moreover, although such transformers typically have a bandwidth that is acceptable for use in cellular telephones, they typically have an insertion loss greater than 1 dB, which is too high.

Opto-couplers are not used at UHF and microwave frequencies due to the junction capacitance of the input LED, non-linearities inherent in the photodetector, limited power handling capability and insufficient isolation to give good common mode rejection.

Above-mentioned U.S. patent application Ser. No. 10/699,481, of which this disclosure is a continuation-in-part, discloses a film acoustically-coupled transformer (FACT) based on decoupled stacked bulk acoustic resonators (DSBARs). A DSBAR is composed of a stacked pair of film bulk acoustic resonators (FBARs) and an acoustic decoupler between the FBARs. FIG. 1A schematically illustrates an embodiment 100 of such FACT. FACT 100 has a first DSBAR 106 and a second DSBAR 108 suspended above a cavity 104 in a substrate 102. DSBAR 106 has a lower FBAR 110, an upper FBAR 120 stacked on lower FBAR 110, and an acoustic coupler 130 between the FBARs, and DSBAR 108 has a lower FBAR 150, an upper FBAR 160 stacked on lower FBAR 150, and an acoustic coupler 170 between the FBARs. Each of the FBARs has opposed planar electrodes and a piezoelectric element between the electrodes. FBAR 110 has opposed planar electrodes 112 and 114 with a piezoelectric element 116 between them. FBAR 120 has opposed planar electrodes 122 and 124 with a piezoelectric element 126 between them.

FACT 100 additionally has a first electrical circuit 141 interconnecting the lower FBAR 110 of DSBAR 106 and the lower FBAR 150 of DSBAR 108 and a second electrical circuit 142 interconnecting the upper FBAR 120 of DSBAR 106 to the upper FBAR 160 of DSBAR 108.

In the embodiment of the above-described FACT shown in FIG. 1A, FBARs 110, 120, 150 and 160 are all nominally equal in impedance and electrical circuit 141 connects lower FBARs 110 and 150 in anti-parallel and to terminals 143 and 144 and electrical circuit 142 connects upper FBARs 120 and 160 in series between terminals 145 and 146. Electrical circuit 142 additionally has a center-tap terminal 147 connected to electrodes 122 and 162 of upper FBARs 120 and 160, respectively. This embodiment has a 1:4 impedance transformation ratio between electrical circuit 141 and electrical circuit 142 or a 4:1 impedance transformation ratio between electrical circuit 142 and electrical circuit 141.

In other embodiments of FACT 100, FBARs 110, 120, 150 and 160 are all nominally equal in impedance, electrical circuit 141 electrically connects the lower FBARs either in anti-parallel or in series, and electrical circuit 142 electrically connects the upper FBARs either in anti-parallel or in series. The possible combinations of electrical circuit configurations just described are summarized in Table 1 below:

TABLE 1

|  | Parallel | Series | Anti-parallel. | Anti-series |
|---|---|---|---|---|
| Parallel | U 1:1 LOW | X | X | U 1:4 |
| Series | X | B 1:1 HI | B 4:1 | X |
| Anti-parallel. | X | B 1:4 | B 1:1 LOW | X |
| Anti-series | U 4:1 | X | X | U 1:1 HI |

In Table 1, the row captions indicate the configuration of electrical circuit 141, the column captions indicate the configuration of electrical circuit 142, B denotes that the FACT is electrically balanced, U denotes that the FACT is unbalanced, and X denotes a non-functioning FACT. The impedance transformation ratio shown is the impedance transformation from the configuration of electrical circuit 141 indicated by the row caption to the configuration of electrical circuit 142 indicated by the column caption. For the configurations having a 1:1 transformation ratio, LOW denotes that the FACT has a low impedance, equivalent to that of two FBARs in parallel, and HI indicates that the FACT has a high impedance, equivalent to that of two FBARs in series.

Inspection of Table 1 indicates that embodiments of the above-described FACT 100 have impedance transformation ratios of 1:1 low impedance, 1:1 high impedance or 1:4 (low impedance to high impedance), generally $1:2^n$, where n=1 or 2. In this disclosure, a transformation ratio of 1:m will be understood to encompass a transformation ratio of m:1, since a FACT with a transformation ratio of 1:m can be converted into a FACT with a transformation ratio of m:1 simply by interchanging the input and output terminals.

While FACT embodiments having impedance transformation ratios of 1:1 or 1:4 are useful in many applications, other applications need different impedance transformation ratios. What is needed, therefore, is a FACT that has the advantages of the FACT described above, but that has an impedance transformation ratio different from 1:1 or 1:4.

SUMMARY OF THE INVENTION

In a first aspect, the invention provides a film acoustically-coupled transformer (FACT) having decoupled stacked bulk acoustic resonators (DSBARs), a first electrical circuit and a second electrical circuit. Each of the DDSBARs has a lower film bulk acoustic resonator (FBAR), an upper FBAR and an acoustic decoupler. The upper FBAR is stacked on the lower FBAR and the acoustic decoupler is located between the FBARs. Each FBAR has opposed planar electrodes and a piezoelectric element between the electrodes. The first electrical circuit interconnects the lower FBARs. The second electrical circuit interconnects the upper FBARs. The FBARs of one of the DDSBARs differ in electrical impedance from the FBARs of another of the DDSBARs.

Embodiments of the FACT have an impedance transformation ratio greater than $1:m^2$, where m is the number of DSBARs. The actual impedance transformation ratio depends on the ratio of the impedances of the FBARs.

In a second aspect, the invention provides a film acoustically-coupled transformer (FACT) having more than two decoupled stacked bulk acoustic resonators (DSBARs), a first electrical circuit and a second electrical circuit. Each of the DSBARs has a first film bulk acoustic resonator (FBAR), a second FBAR and an acoustic decoupler. One of the FBARs is stacked on the other of the FBARs and the acoustic decoupler is located between the FBARs. Each FBAR has opposed planar electrodes and a piezoelectric element between the electrodes. The first electrical circuit interconnects the first FBARs of the DDSBARs. The second electrical circuit interconnects the second FBARs of the DDSBARs.

Some embodiments of the FACT have an impedance transformation ratio of $1:m^2$, where m is the number of DSBARs, greater than two. Other embodiments, in which at least one of the electrical circuits provides serial and parallel connections among the respective FBARs, have an impedance transformation ratio with certain integer and fractional values less than $1:m^2$. The actual impedance transformation ratio depends on the manner in which the first and second electrical circuits interconnect the respective FBARs.

In a third aspect, the invention provides a film acoustically-coupled transformer (FACT) having decoupled stacked bulk acoustic resonators (DSBARs), a first electrical circuit and a second electrical circuit. Each of the DSBARs has a first film bulk acoustic resonator (FBAR), a second FBAR and an acoustic decoupler. One of the FBARs stacked on the other of the FBARs and the acoustic decoupler is located between the FBARs. Each FBAR has opposed planar electrodes and a piezoelectric element between the electrodes. The first electrical circuit interconnects the first FBARs. The second electrical circuit interconnects the second FBARs. The FACT has an impedance transformation ratio that differs from 1:1 and $1:m^2$, where m is the number of the DSBARs.

In some embodiments of the FACT in accordance with the invention, the FBARs of one of the DSBARs differ in impedance from the FBARs of another of the DSBARs to provide the impedance transformation ratio that differs from 1:1 and $1:m^2$.

In other embodiments of the FACT in accordance with the invention, the DSBARs number more than two, the first electrical circuit interconnects the first FBARs in a first circuit arrangement comprising series and parallel connections among the first FBARs, and the second electrical circuit interconnects the second FBARs in a second circuit arrangement, different from the first circuit arrangement to provide the impedance transformation ratio that differs from 1:1 and 1 $m^2$.

DETAILED DESCRIPTION

Figure 2A:
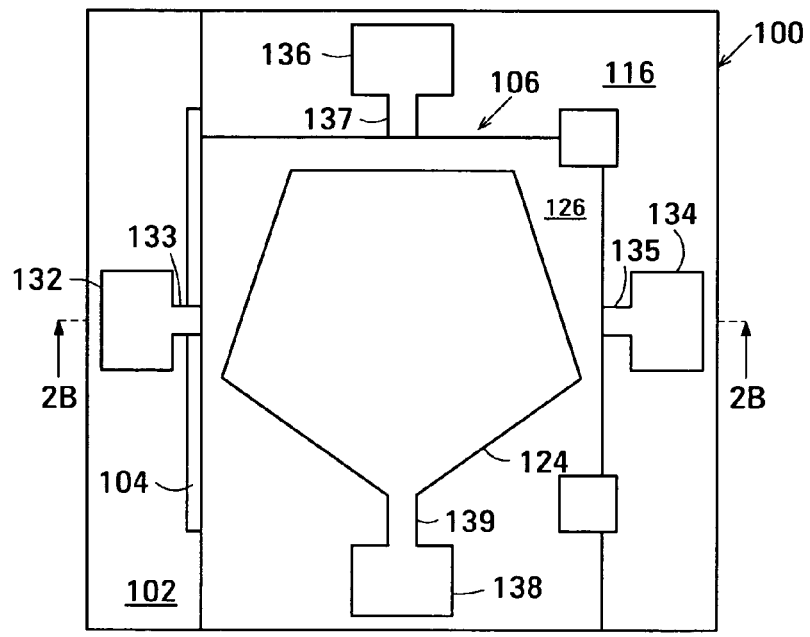
FIGS. 2A and 2B are respectively a plan view and a cross-sectional view along the section line 2B—2B in FIG. 2A of an embodiment of a DSBAR that constitutes the basic building block of embodiments of a FACT in accordance with the invention.
Figure 2B:
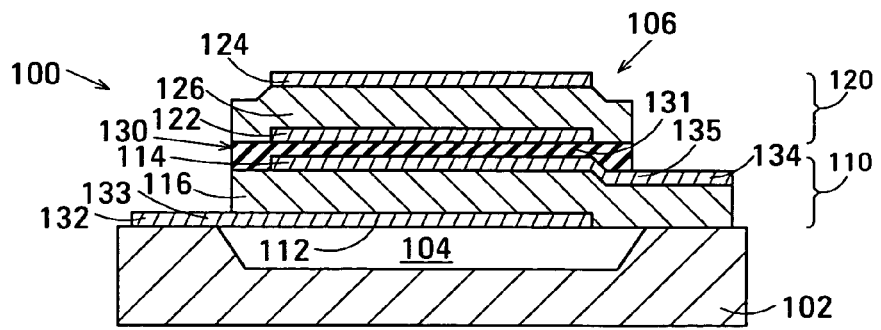

FIGS. 2A and 2B are respectively a plan view and a cross-sectional view of an embodiment of a decoupled stacked bulk acoustic resonantor (DSBAR) 106 that constitutes the basic building block of embodiments of a film acoustically-coupled transformer (FACT) in accordance with a first aspect of the invention. DSBAR 106 is composed of a lower film bulk acoustic resonator (FBAR) 110, and upper FBAR 120 stacked on lower FBAR 110, and an acoustic decoupler 130 between the FBARs. FBAR 110 is composed of opposed planar electrodes 112 and 114 and a piezoelectric element 116 between the electrodes. FBAR 120 is composed of opposed planar electrodes 122 and 124 and a piezoelectric element 126 between the electrodes. Acoustic decoupler 130 is located between electrode 114 of FBAR 110 and electrode 122 of FBAR 120. The acoustic decoupler controls the coupling of acoustic energy between FBARs 110 and 120.

DSBAR 106 has first terminals 132 and 134 and second terminals 136 and 138 each structured in the example shown as a bonding pad. First terminals 132 and 134 are electrically connected by electrical traces 133 and 135, respectively, to electrodes 112 and 114, respectively, of lower FBAR 110. Second terminals 136 and 138 are electrically connected by electrical traces 137 and 139, respectively, to electrodes 122 and 124, respectively, of upper FBAR 120.

In the example shown, DSBAR 106 is suspended over a cavity 104 defined in a substrate 102. Suspending the DSBAR over a cavity allows the FBARs of the DSBAR to resonate mechanically. Other suspension schemes that allow the FBARs to resonate mechanically are possible. For example, the DSBAR can be supported by a mismatched acoustic Bragg reflector (not shown) formed in or on substrate 102, as disclosed by Lakin in U.S. Pat. No. 6,107,721, the disclosure of which is incorporated into this disclosure by reference.

In the example of DSBAR 106 shown in FIGS. 2A and 2B, acoustic decoupler 130 is composed of an acoustic decoupling layer 131 of acoustic decoupling material located between the electrodes 114 and 122 of FBARs 110 and 120, respectively. Important properties of the acoustic decoupling material of acoustic decoupling layer 131 are an acoustic impedance different from that of the materials of FBARs 110, 120, a high electrical resistivity, a low dielectric permittivity and a nominal thickness that is an odd integral multiple of one quarter of the wavelength in the acoustic decoupling material of an acoustic signal equal in frequency to the center frequency of the pass band of DSBAR 106.

In the example shown, the acoustic decoupling material of acoustic decoupling layer 131 has an acoustic impedance less that of the materials of FBARs 110 and 120 and substantially greater than that of air. The acoustic impedance of a material is the ratio of stress to particle velocity in the material and is measured in Rayleighs, abbreviated as rayl.

The materials of FBARs 110 and 120 are typically aluminum nitride (AlN) as the material of piezoelectric elements 116, 126 and molybdenum (Mo) as the material of electrodes 112, 114, 122 and 124. The acoustic impedances of the materials of the FBARs are typically greater than 30 Mrayl (35 Mrayl for AlN and 63 Mrayl for Mo) and the acoustic impedance of air is about 1 krayl. In embodiments of DSBAR 106 in which the materials of FBARs 110, 120 are as stated above, materials with an acoustic impedance in the range from about 2 Mrayl to about 8 Mrayl work well as the acoustic coupling material of acoustic decoupling layer 131.

In the embodiment of acoustic decoupler 130 shown in FIG. 2B, acoustic decoupling layer 131 has a nominal thickness equal to one quarter of the wavelength in the acoustic decoupling material of an acoustic signal equal in frequency to the center frequency of the pass band of DSBAR 106, i.e., $t \approx \lambda_n/4$, where t is the thickness of acoustic decoupling layer 131 and $\lambda_n$ is the wavelength in the acoustic decoupling material of an acoustic signal equal in frequency to the center frequency of the pass band of DSBAR 106. A thickness of acoustic decoupling layer 131 within approximately ±10% of the nominal thickness can alternatively be used. A thickness outside this range can alternatively be used with some degradation in performance. However, the thickness of acoustic decoupling layer 131 should differ significantly from $0\lambda_n$ at one extreme and $\lambda_n/2$ at the other extreme.

More generally, acoustic decoupling layer 131 can have a nominal thickness equal to an odd integral multiple of one quarter of the wavelength in the acoustic decoupling material of an acoustic signal equal in frequency to the center frequency of the pass band of DSBAR 106, i.e., $t \approx (2m+1)\lambda_n/4$, where t and $\lambda_n$ are as defined above and m is an integer equal to or greater than zero. In this case, a thickness of acoustic decoupling layer 131 that differs from the nominal thickness by approximately ±10% of $\lambda_n/4$ can alternatively be used. A thickness tolerance outside this range can be used with some degradation in performance, but the thickness of acoustic decoupling layer 131 should differ significantly from an integral multiple of $\lambda_n/2$. However, embodiments of acoustic decoupler 130 in which acoustic decoupling layer 131 is an odd integral multiple greater than unity of one quarter of the wavelength in the acoustic decoupling material of an acoustic signal equal in frequency to the center frequency of DSBAR 106 typically have frequency responses that exhibit spurious response artifacts due to the ability of such thicker layer to support multiple acoustic modes.

Many plastic materials have acoustic impedances in the range stated above and can be applied in layers of uniform thickness in the thickness ranges stated above. Such plastic materials are therefore potentially suitable for use as the acoustic decoupling material of acoustic decoupling layer 131. However, the acoustic decoupling material must also be capable of withstanding the temperatures of the fabrication operations performed after acoustic decoupling layer 131 has been deposited on electrode 114. As will be described in more detail below, in practical embodiments of FACT 100, electrodes 122 and 124 and piezoelectric layer 126 are deposited by sputtering after acoustic decoupling layer 131 has been deposited. Temperatures as high as 400° C. are reached during these deposition processes. Thus, a plastic that remains stable at such temperatures is used as the acoustic decoupling material.

Plastic materials typically have a very high acoustical attenuation per unit length compared with the other materials of FBARs 110 and 120. However, since the plastic acoustic decoupling layer 131 in the above-described embodiment of acoustic decoupler 130 is typically less than 1 μm thick, the acoustic attenuation introduced by such embodiment of acoustic decoupler 130 is typically negligible.

In one embodiment, a polyimide is used as the acoustic decoupling material of acoustic decoupling layer 131. Polyimide is sold under the trademark Kapton® by E. I. du Pont de Nemours and Company. In such embodiment, acoustic decoupler 130 is composed of acoustic decoupling layer 131 of polyimide applied to electrode 114 by spin coating. Polyimide has an acoustic impedance of about 4 Mrayl.

In another embodiment, a poly(para-xylylene) is used as the acoustic decoupling material of acoustic decoupling layer 131. In such embodiment, acoustic decoupler 130 is composed of acoustic decoupling layer 131 of poly(para-xylylene) applied to electrode 114 by vacuum deposition. Poly(para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl.

In another embodiment, a crosslinked polyphenylene polymer is used as the acoustic decoupling material of acoustic decoupling layer 131. In such embodiment, acoustic decoupling layer 131 is a layer of a crosslinked polyphenylene polymer applied by spin coating. Crosslinked polyphenylene polymers have been developed as low dielectric constant dielectric materials for use in integrated circuits and consequently remain stable at the high temperatures to which acoustic decoupler 130 is subject during the subsequent fabrication of FBAR 120. The inventors have discovered that crosslinked polyphenylene polymers additionally have a calculated acoustic impedance of about 2 Mrayl. This acoustic impedance is in the range of acoustic impedances that provides DSBAR 106 with a useful pass bandwidth.

Precursor solutions containing various oligomers that polymerize to form respective crosslinked polyphenylene polymers are sold by The Dow Chemical Company, Midland, Mich., under the trademark SiLK. The precursor solutions are applied by spin coating. The crosslinked polyphenylene polymer obtained from one of these precursor solutions designated SiLK™ J, which additionally contains an adhesion promoter, has a calculated acoustic impedance of 2.1 Mrayl, i.e., about 2 Mrayl.

The oligomers that polymerize to form crosslinked polyphenylene polymers are prepared from biscyclopentadienone- and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents, then cures the oligomer to form a cross-linked polymer. The biscyclopentadienones react with the acetylenes in a 4+2 cycloaddition reaction that forms a new aromatic ring. Further curing results in the cross-linked polyphenylene polymer. The above-described crosslinked polyphenylene polymers are disclosed by Godschalx et al. in U.S. Pat. No. 5,965,679, incorporated herein by reference. Additional practical details are described by Martin et al., *Development of Low-Dielectric Constant Polymer for the Fabrication of Integrated Circuit Interconnect*, 12 ADVANCED MATERIALS, 1769 (2000), also incorporated by reference. Compared with polyimide, crosslinked polyphenylene polymers have a lower acoustic impedance, a lower acoustic attenuation and a lower dielectric constant. Moreover, a spun-on layer of the precursor solution is capable of producing a high-quality film of the crosslinked polyphenylene polymer with a thickness of the order of 200 nm, which is a typical thickness of acoustic decoupler 130.

In an alternative embodiment, acoustic decoupler 130 is composed of acoustic decoupling layers (not shown) of acoustic decoupling materials having different acoustic impedances as described in the above-mentioned U.S. patent application Ser. No. 10/965,449 of John D. Larson III and Stephen Ellis entitled *Pass Bandwidth Control in Decoupled Stacked Bulk Acoustic Resonator Devices*. The acoustic impedances and thicknesses of the acoustic decoupling layers collectively define the acoustic impedance of acoustic decoupler 130. The acoustic impedance of the acoustic decouplers in turn defines the pass bandwidth of DSBAR 106. The embodiment of acoustic decoupler 130 composed of acoustic decoupling layers of acoustic decoupling materials having different acoustic impedances is structured to impose a nominal phase change of an odd integral multiple of $\pi/2$ radians on an acoustic signal equal in frequency to the center frequency of the pass band of DSBAR 106. In an embodiment, the acoustic decoupler is structured to impose a nominal phase change of $\pi/2$ radians on an acoustic signal equal in frequency to the center frequency. This phase change is equal to the nominal phase change imposed by an acoustic decoupler composed of a single layer of acoustic decoupling material having a nominal thickness equal to one quarter of the wavelength in the acoustic decoupling material of an acoustic signal equal in frequency to the center frequency.

In an example, acoustic decoupler 130 was composed of an acoustic decoupling layer of a crosslinked polyphenylene polymer having an acoustic impedance of about 2 Mrayl atop an acoustic decoupling layer of polyimide having an acoustic impedance of about 4 Mrayl. Such acoustic decoupler provides an embodiment of DSBAR 106 with a pass bandwidth intermediate between the pass bandwidths of embodiments in which the acoustic decouplers are composed of single acoustic decoupling layer 131 of polyimide or single acoustic decoupling layer 131 of the crosslinked polyphenylene polymer.

In an alternative embodiment, the acoustic decoupling material of acoustic decoupling layer 131 has an acoustic impedance substantially greater than the materials of FBARs 110 and 120. No materials having this property are known at this time, but such materials may become available in future. Alternatively, FBAR materials with lower acoustic impedances may become available in future. The thickness of acoustic decoupling layer 131 of such high acoustic impedance acoustic decoupling material is as described above.

In another embodiment (not shown), acoustic decoupler 130 is structured as a Bragg structure composed of a low acoustic impedance Bragg element sandwiched between high acoustic impedance Bragg elements. The low acoustic impedance Bragg element is a layer of a low acoustic impedance material whereas the high acoustic impedance Bragg elements are each a layer of high acoustic impedance material. The acoustic impedances of the Bragg elements are characterized as "low" and "high" with respect to one another and additionally with respect to the acoustic impedance of the piezoelectric material of piezoelectric elements 116 and 126. At least one of the Bragg elements additionally has a high electrical resistivity and a low dielectric permittivity to provide electrical isolation between input and output of DSBAR 106.

Each of the layers constituting the Bragg elements has a nominal thickness equal to an odd integral multiple of one quarter of the wavelength in the material the layer of an acoustic signal equal in frequency to the center frequency of DSBAR 106. Layers that differ from the nominal thickness by approximately ±10% of one quarter of the wavelength can alternatively be used. A thickness tolerance outside this range can be used with some degradation in performance, but the thickness of the layers should differ significantly from an integral multiple of one-half of the wavelength.

In an embodiment, the low acoustic impedance Bragg element is a layer of silicon dioxide ($SiO_2$), which has an acoustic impedance of about 13 Mrayl, and each of the high acoustic impedance Bragg elements is a layer of the same material as electrodes 114 and 122, e.g., molybdenum, which has an acoustic impedance of about 63 Mrayl. Using the same material for the high acoustic impedance Bragg elements and the electrodes of FBARs 110 and 120 allows the high acoustic impedance Bragg elements additionally to serve as the electrodes of the FBARs adjacent the acoustic coupling elements.

In DSBAR 106, to a first approximation, the electrical impedance of FBAR 110 is determined by the capacitance of the capacitor formed by electrodes 112 and 114 and piezoelectric element 116 and the electrical impedance of FBAR 120 is determined by the capacitance of the capacitor formed by electrodes 122 and 124 and piezoelectric element 126. Specifically, the capacitance $C_{110}$ of FBAR 110 is given by:

$$C_{110} = \epsilon A/t_0$$

where A is the area of the electrode 112 or electrode 114 and $\epsilon$ and $t_0$ are the dielectric constant and thickness, respectively, of piezoelectric element 116.

The impedance $Z_{110}$ of FBAR 110 at a frequency f is approximated by:

$$Z_{110} \approx 1/2\pi f C_{110}$$

Similar expressions applied to electrodes 122 and 124 and piezoelectric element 126 are used to determine the capacitance and impedance of FBAR 120. Since electrodes 112, 114, 122 and 124 are typically nominally equal in area and piezoelectric elements 116 and 126 are typically nominally equal in thickness and dielectric constant, the capacitances and, hence, impedances of FBARs 110 and 120 are nominally equal.

Figure 1:
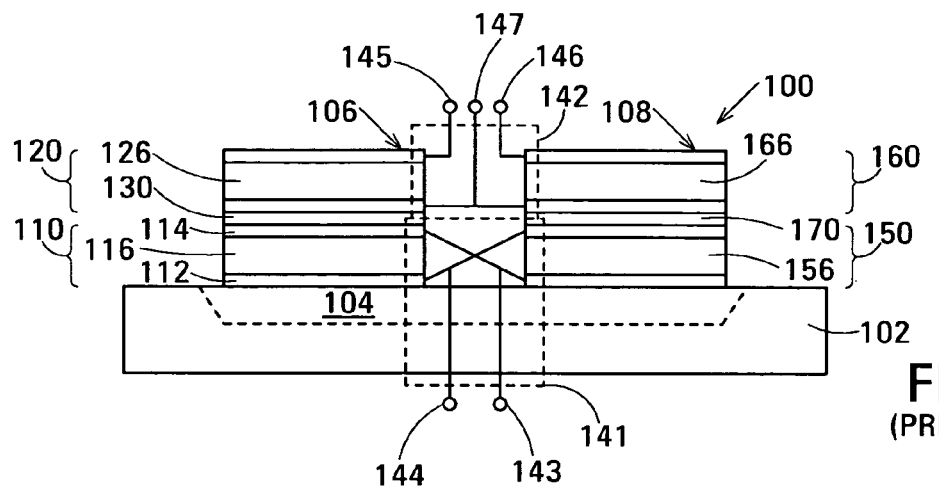
FIG. 1 is a schematic drawing of the electrical circuits of an embodiment of a 1:4 or 4:1 film acoustically-coupled transformer (FACT) in accordance with the prior art.

In the two-DSBAR FACT 100 described above with reference to FIG. 1, electrical circuit 141 connects lower FBAR 110 of DSBAR 106 and structurally-similar lower FBAR 150 of structurally-similar DSBAR 108 in anti-parallel. Accordingly, the impedance of FACT 100 measured between terminals 143 and 144 is the parallel impedance of FBARs 110 and 150, i.e., one-half of the impedance of FBAR 110 or FBAR 150. Additionally, electrical circuit 142 connects upper FBAR 120 of DSBAR 106 and structurally-similar upper FBAR 160 of structurally-similar DSBAR 108 in series. Accordingly, the impedance of FACT 100 measured between terminals 145 and 146 is the series impedance of FBARs 120 and 160, i.e., twice of the impedance of FBAR 120 or FBAR 160. Since the impedances of FBARs 110, 120, 150 and 160 are all equal, FACT 100 has a 1:4 impedance ratio, as noted above.

Figure 3A:
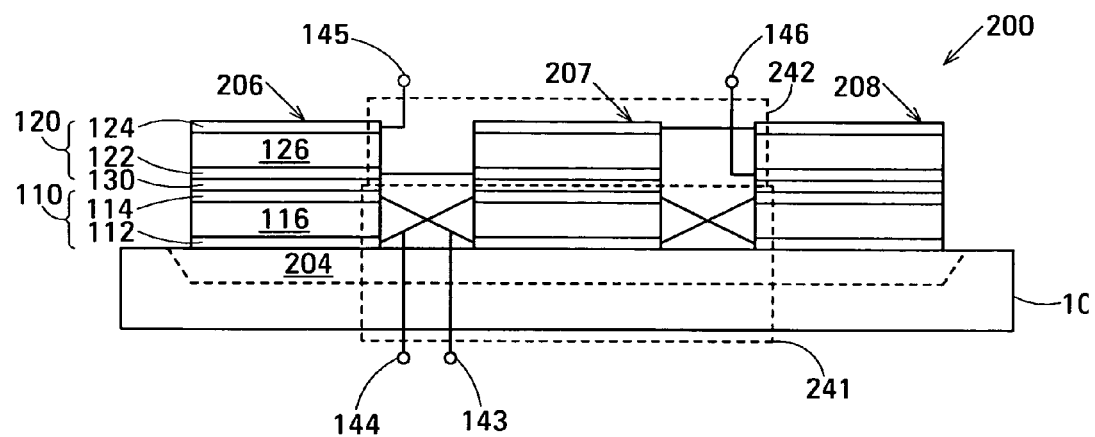
FIG. 3A is a schematic diagram of a first exemplary embodiment of a three-DSBAR FACT in accordance with the invention.

FIG. 3A is a schematic drawing of a first embodiment 200 of a three-DSBAR film acoustically-coupled transformer (FACT) in accordance with the invention. This embodiment is composed of three DSBARs and has a 1:9 impedance transformation ratio. FACT 200 is composed of a first stacked bulk acoustic resonator (DSBAR) 206, a second DSBAR 207 and a third DSBAR 208 suspended over a cavity 204 in a substrate 102. Each DSBAR is structurally similar to DSBAR 106 described above with reference to FIGS. 2A and 2B. FIG. 3A shows the elements of DSBAR 206. Corresponding elements of DSBARs 207 and 208 will be referred by the same reference numerals in the description below.

DSBARs 206, 207 and 208 each have a structure similar to that of DSBAR 106 described above with reference to FIGS. 2A–2C and are each composed of lower film bulk acoustic resonator (FBAR) 110, upper FBAR 120 stacked on the lower DSBAR, and acoustic decoupler 130 between the FBARs. Each of the FBARs has opposed planar electrodes and a piezoelectric element between the electrodes. FBAR 110 is composed of opposed planar electrodes 112 and 114 with piezoelectric element 116 between them. FBAR 120 is composed of opposed planar electrodes 122 and 124 with piezoelectric element 126 between them.

FACT 200 additionally has a first electrical circuit 241 and a second electrical circuit 242. First electrical circuit 241 connect the lower FBARs 110 of DSBARs 206 and 207 in anti-parallel and connects the lower FBARs 110 of DSBARs 207 and 208 in anti-parallel and to terminals 143 and 144. Specifically, electrical circuit 241 connects electrode 112 of DSBAR 206 to terminal 144 and to electrode 114 of DSBAR 207 and connects electrode 114 of DSBAR 207 to electrode 112 of DSBAR 208. Electrical circuit 241 additionally connects electrode 114 of DSBAR 206 to terminal 143 and to electrode 112 of DSBAR 207 and connects electrode 112 of DSBAR 207 to electrode 114 of DSBAR 208.

Electrical circuit 242 connects the upper FBARs 120 of DSBARs 206, 207 and 208 in series between terminals 145 and 146. Specifically, electrical circuit 242 connects terminal 145 to electrode 124 of DSBAR 206, electrode 122 of DSBAR 206 to electrode 122 of DSBAR 207, electrode 124 of DSBAR 207 to electrode 124 of DSBAR 208 and electrode 122 of DSBAR 208 to terminal 146.

The electrodes 112, 114, 122 and 124 of DSBARs 206, 207 and 208 are nominally equal in area and piezoelectric elements 116 and 126 are nominally equal in thickness and dielectric constant. Consequently, the capacitances and, hence, the impedances, of FBARs 110 and 120 of DSBARs 206, 207 and 208 are all nominally equal. Electrical circuit 241 connects the lower FBARs 110 of DSBARs 206, 207 and 208 in anti-parallel. Accordingly, the impedance of FACT 200 measured between terminals 143 and 144 is the parallel impedance of the lower FBARs 110, i.e., one-third of the impedance of each lower FBAR 110. Additionally, electrical circuit 242 connects the upper FBARs 120 of DSBARs 206, 207 and 208 in series. Accordingly, the impedance of FACT 200 measured between terminals 145 and 146 is the series impedance of the FBARs 120 of DSBARs 206, 207 and 208, i.e., three times the impedance of each FBAR 120. Since the impedances of FBARs 110 and 120 are all equal, FACT 200 has a (1/3)/3=1:9 impedance transformation ratio, as noted above.

Figure 3B:
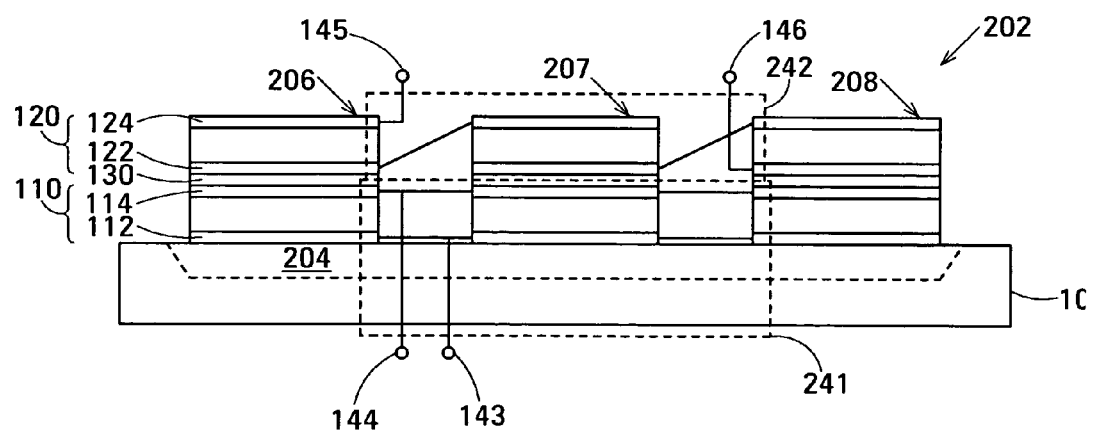
FIG. 3B is a schematic diagram of a second exemplary embodiment of a three-DSBAR FACT in accordance with the invention.

FIG. 3B shows an alternative embodiment 202 of a three-DSBAR film acoustically-coupled transformer (FACT) in accordance with the invention also having an impedance transformation ration of 1:9. In this embodiment, electrical circuit 241 connects the lower FBARs 110 of DSBARs 206, 207 and 208 in parallel and to terminals 143 and 144. Additionally, electrical circuit 242 connects the upper FBARs 120 of DSBARs 206, 207 and 208 in anti-series between terminals 145 and 146.

Embodiments of electrical circuit 241 may interconnect the lower FBARs 110 of DSBARs 206, 207 and 208 in circuit arrangements different from those shown in FIGS. 3A and 3B to provide different impedances between terminals 143 and 144. Additionally, embodiments of electrical circuit 242 may interconnect the upper FBARs 120 of DSBARs 206, 207 and 208 in circuit arrangements different from those shown in FIGS. 3A and 3B to provide different impedances between terminals 145 and 146. The different impedances can be used to provide embodiments of FACT 300 impedance transformation ratios different that illustrated.

FIGS. 3C–3F schematically illustrate respective circuit arrangements in which respective embodiments of electrical circuit 241 may interconnect the lower FBARs 110 of DSBARs 206–208 and respective embodiments of electrical circuit 242 may interconnect the upper FBARs 120 of DSBARs 206–208. In each of FIGS. 3C–3F, FBARs 311, 313 and 315 are the lower FBARs 110 of DSBARs 206, 207 and 208, respectively, and terminals T1 and T2 are terminals 143 and 144 when the Figure represents an embodiment of electrical circuit 241; and FBARs 311, 313 and 315 are the upper FBARs 120 of DSBARs 206, 207 and 208, respectively, and terminals T1 and T2 are terminals 145 and 146 when the Figure represents an embodiment of electrical circuit 242. In the descriptions of FIGS. 3C–3F, the FBARs are described as being connected in either or both of series and parallel. However, as used in this disclosure in connection with the interconnection of the FBARs, the term series will be regarded as encompassing anti-series and the term parallel will be regarded as encompassing anti-parallel.

Figure 3C:
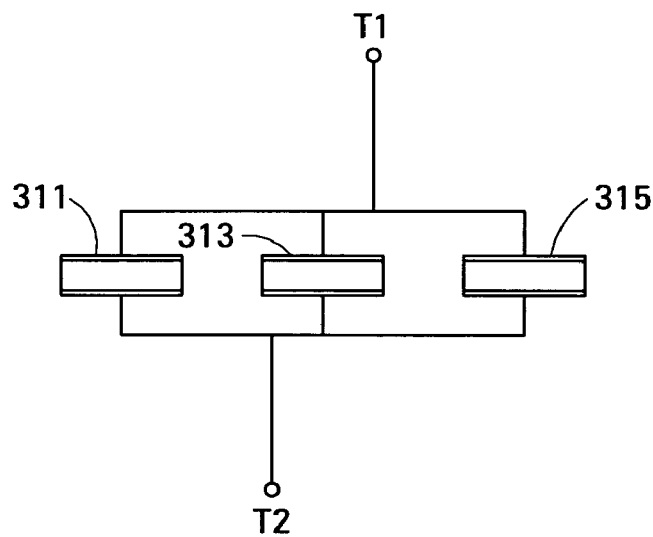
FIGS. 3C–3F schematically illustrate the ways in which the lower FBARs and the upper FBARs can be interconnected in a three-DSBAR FACT in accordance with the invention.

FIG. 3C shows a first embodiment of electrical circuit 241 or electrical circuit 242 that connects FBARs 311, 313 and 315 in parallel between terminals T1 and T2. In this embodiment, the impedance between terminals T1 and T2 is $Z/3$, where Z is the impedance of each of the FBARs 311, 313 and 315. FBARs 311, 313 and 315 are assumed to be equal in impedance. FIG. 3C illustrates the circuit arrangement in which electrical circuit 241 interconnects the lower FBARs 110 of DSBARs 206–208 in FIG. 3B.

Figure 3D:
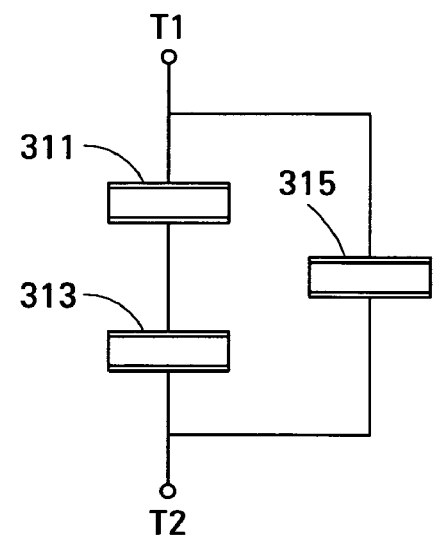

FIG. 3D shows a second embodiment of electrical circuit 241 or electrical circuit 242 that connects FBARs 311 and 313 in series and additionally connects FBAR 315 in parallel with the series combination of FBARs 311 and 313 between terminals T1 and T2. In this embodiment, the impedance between terminals T1 and T2 is $(2Z^2/3Z)=2Z/3$.

Figure 3E:
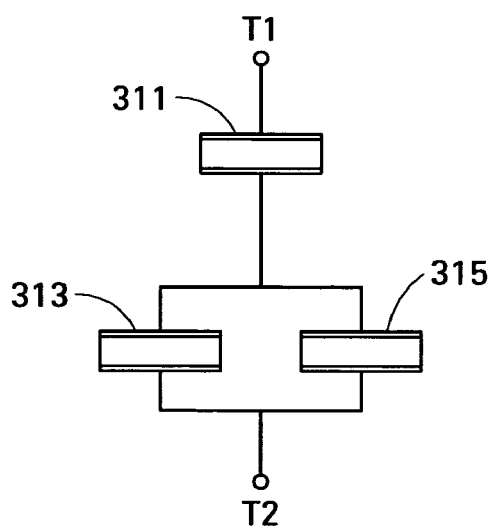

FIG. 3E shows a third embodiment of electrical circuit 241 or electrical circuit 242 that connects FBARs 313 and 315 in parallel and additionally connects FBAR 311 in series with the parallel combination of FBARs 313 and 315 between terminals T1 and T2. In this embodiment, the impedance between terminals T1 and T2 is $(Z+Z/2)=3Z/2$.

Figure 3F:
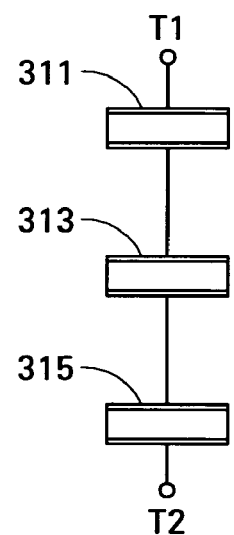

FIG. 3F shows a fourth embodiment of electrical circuit 241 or electrical circuit 242 that connects FBARs 311, 313 and 315 in series between terminals T1 and T2. In this embodiment, the impedance between terminals T1 and T2 is $3Z$. FIG. 3F illustrates the circuit arrangement in which electrical circuit 242 interconnects the upper FBARs 120 of DSBARs 206–208 in FIG. 3A.

Pairs of the embodiments of electrical circuits 241 and 242 described above with reference to FIGS. 3C–3F may be used in combination to provide embodiments of FACT 200 having five different impedance transformation ratios ranging from 1:1 to 1:9 between terminals 143 and 144 and terminals 145 and 146, as shown in Table 2. In counting the number of different impedance transformation ratios, ratios that are the inverse of one another, e.g., 1:9 and 9:1, are counted as a single ratio. However, the impedance transformation ratios are each provided at two or more impedance levels. For example, an impedance transformation ratio of 9:4 (or 4:9) is provided at two different impedance levels of circuit 241, i.e., $2Z/3$ or $3Z/2$.

TABLE 2

| | Circuit 242 imp. | | | |
|---|---|---|---|---|
| Circuit 241 imp. | ⅓ (FIG. 3C) | ⅔ (FIG. 3D) | 3/2 (FIG. 3E) | 3 (FIG. 3F) |
| ⅓ (FIG. 3C) | 1:1 | 2:1 | 9:2 | 9:1 |
| ⅔ (FIG. 3D) | 1:2 | 1:1 | 9:4 | 9:2 |
| 3/2 (FIG. 3E) | 2:9 | 4:9 | 1:1 | 2:1 |
| 3 (FIG. 3F) | 1:9 | 2:9 | 1:2 | 1:1 |

In Table 2, the row captions show the impedance of electrical circuit 241 between terminals 143 and 144 as a multiple of Z, the impedance of each of the FBARs 311, 313 and 315, the column captions show the impedance of electrical circuit 242 between terminals 145 and 146 as a multiple of Z, and the table entries show the impedance transformation ratio between the impedance and configuration of electrical circuit 241 indicated by the respective row caption and the impedance and configuration of electrical circuit 242 indicated by the respective column caption. The row captions and column captions additionally show the Figure number of the corresponding circuit that produces the indicated impedance. The impedances shown in the row and column captions and the impedance transformation ratios shown in the body of the table are indicated by vulgar fractions since vulgar fractions characterize these quantities more accurately than decimals.

In making the combinations set forth in Table 2, upper FBARs above lower FBARs connected in parallel should be connected in anti-series, upper FBARs above lower FBARs connected in anti-parallel should connected in series, upper FBARs above lower FBARs connected in series should be connected in anti-parallel, and upper FBARs above lower FBARs connected in anti-series should connected in parallel. For example, in FIG. 3A, the upper FBARs 120 of DSBARs 206–208 above the anti-parallel connected lower FBARs 110 are connected in series, whereas, in FIG. 3B, the upper FBARs 120 of DSBARs 206–208 above the parallel-connected lower FBARs 110 are connected in anti-parallel. To meet these conditions in practical embodiments of FACT 200, FBARs described above as being connected in parallel may instead be connected in anti-parallel and FBARs described above as being connected in series may instead be connected in anti-series. Not meeting the conditions just stated causes the signals generated by the upper FBARs to cancel. This topic is described in more detail in the above-mentioned U.S. patent application Ser. No. 10/699,481, the disclosure of which is incorporated herein by reference.

Figure 4A:
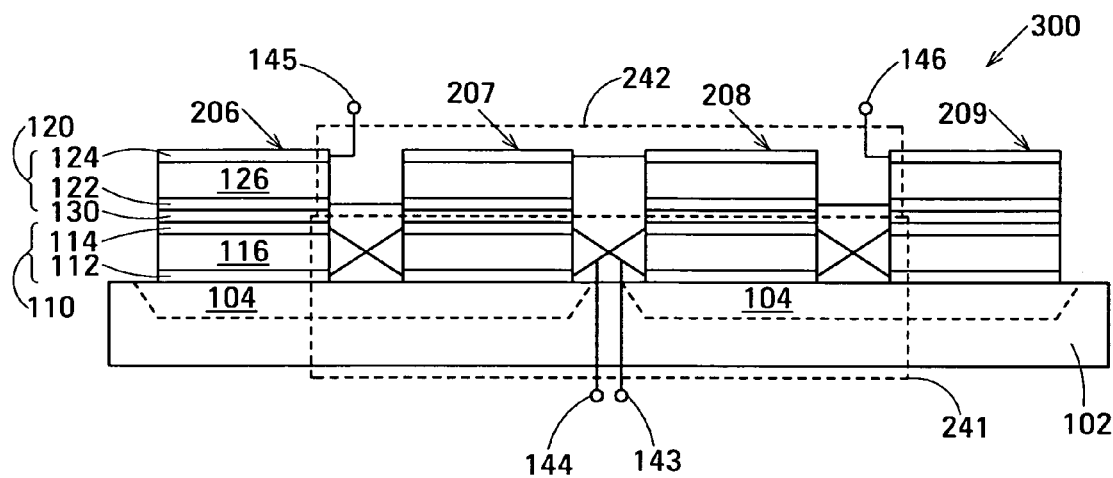
FIG. 4A is a schematic diagram of a first exemplary embodiment of a four-DSBAR FACT in accordance with the invention.

FIG. 4A is a schematic drawing of a second embodiment 300 of a four-DSBAR film acoustically-coupled transformer (FACT) in accordance with the invention. This embodiment is composed of four DSBARs and has a 1:16 impedance transformation ratio. Elements of FACT 300 that correspond to elements of FACT 200 described above with reference to FIG. 3A are indicated using the same reference numerals and will not be described again here.

FACT 300 additionally has a fourth stacked bulk acoustic resonator (DSBAR) 209 suspended over substrate 102. DSBAR 209 is structurally similar to DSBAR 106 described above with reference to FIGS. 2A and 2B. Elements of DSBAR 209 corresponding to those of DSBAR 206 will be referred by the same reference numerals in the description below. DSBAR 209 is composed of a lower film bulk acoustic resonator (FBAR) 110, an upper FBAR 120 stacked on the lower DSBAR, and an acoustic decoupler 130 between the FBARs. Each of the FBARs has opposed planar electrodes and a piezoelectric element between the electrodes.

Electrical circuit 241 of FACT 202 connects the lower FBARs 110 of FBARs 206, 207 and 208 in anti-parallel and to terminals 143 and 144, as described above, and additionally connects the lower FBAR 110 of DSBAR 209 in anti-parallel with lower DSBAR 110 of DSBAR 208. Electrical circuit 242 of FACT 202 connects the upper FBARs 120 of DSBARs 206, 207 and 208 in series and to terminal 145, and additionally connects the upper FBAR 120 of DSBAR 209 in series with the upper FBARs of DSBARs 206, 207 and 208 and to terminal 146.

With the electrical connections just described, the impedance of FACT 300 measured between terminals 143 and 144 is the parallel impedance of the lower FBARs 110 of DSBAR 206–209, i.e., one-quarter of the impedance each lower FBAR 110. Additionally, the impedance of FACT 300 measured between terminals 145 and 146 is the series impedance of the upper FBARs 120 of DSBARs 206–209, i.e., four times the impedance of each FBAR 120. Since the FBARs 110 and 120 are all equal in impedance, FACT 300 has a 1:16 impedance transformation ratio, as noted above.

Figure 4B:
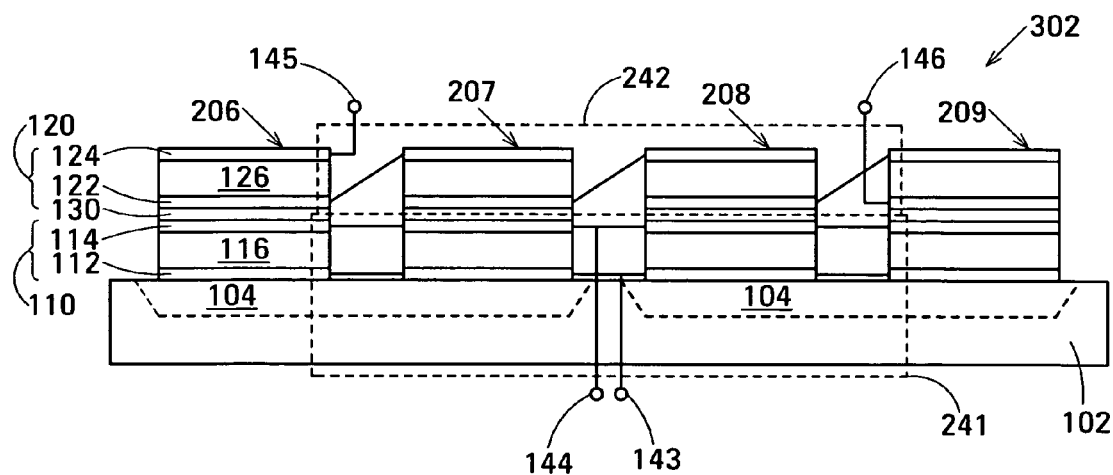
FIG. 4B is a schematic diagram of a second exemplary embodiment of a four-DSBAR FACT in accordance with the invention.

FIG. 4B shows an alternative embodiment 302 of a four-DSBAR film acoustically-coupled transformer (FACT) in accordance with the invention. FACT 302 also has an impedance transformation ratio of 1:16. In this embodiment, electrical circuit 241 connects the lower FBARs 110 of DSBARs 206, 207, 208 and 209 in parallel and to terminals 143 and 144. Additionally, electrical circuit 242 connects the upper FBARs 120 of DSBARs 206, 207, 208 and 209 in anti-series.

FIGS. 4C–4I schematically illustrate respective circuit arrangements in which respective embodiments of electrical circuit 241 may interconnect the lower FBARs 110 of DSBARs 206–209 and respective embodiments of electrical circuit 242 may interconnect the upper FBARs 120 of DSBARs 206–209. In each of FIGS. 4C–4I, FBARs 311, 313, 315 and 317 are the lower FBARs 110 of DSBARs 206, 207 and 208, respectively, and terminals T1 and T2 are terminals 143 and 144 when the Figure represents an embodiment of electrical circuit 241, and FBARs 311, 313, 315 and 317 are the upper FBARs 120 of DSBARs 206, 207 and 208, respectively, and terminals T1 and T2 are terminals 145 and 146 when the Figure represents an embodiment of electrical circuit 242. In the descriptions of FIGS. 4C–4I, the FBARs are described as being connected in either or both of series and parallel. However, as used in this disclosure in connection with the interconnection of the FBARs, the term series will be regarded as encompassing anti-series and the term parallel will be regarded as encompassing anti-parallel.

Figure 4C:
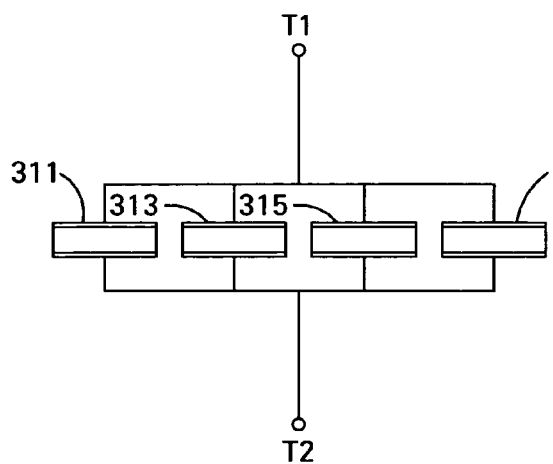
FIGS. 4C–4I schematically illustrate the ways in which the lower FBARs and the upper FBARs can be interconnected in a four-DSBAR FACT in accordance with the invention.

FIG. 4C shows a first embodiment of electrical circuit 241 or electrical circuit 242 that connects FBARs 311, 313, 315 and 317 in parallel between terminals T1 and T2. In this embodiment, the impedance between terminals T1 and T2 is Z/4, where Z is the impedance of each of the FBARs 311, 313, 315, and 317. FBARs 311, 313 and 315 are assumed to be equal in impedance. FIG. 4C illustrates the configuration in which electrical circuit 241 interconnects the lower FBARs 110 of DSBARs 206–209 in FIG. 4B.

Figure 4D:
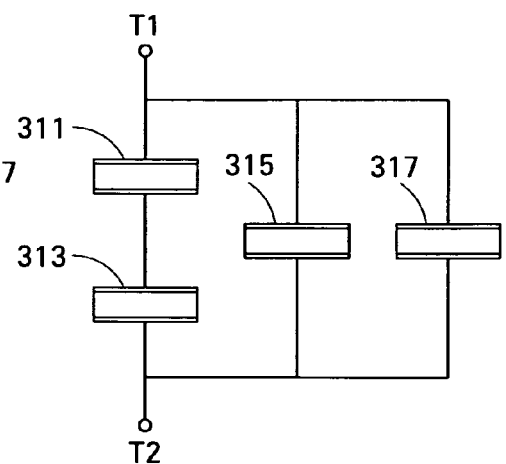

FIG. 4D shows a second embodiment of electrical circuit 241 or electrical circuit 242 that connects FBARs 311 and 313 in series and additionally connects FBARs 315 and 317 and the series combination of FBARs 311 and 313 in parallel between terminals T1 and T2. In this embodiment, the impedance between terminals T1 and T2 is $1/((1/Z)+(1/Z)+(1/2Z))=2Z/5$.

Figure 4E:
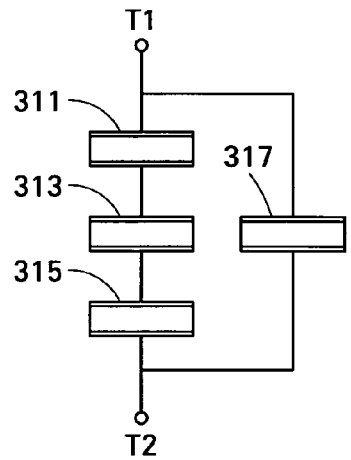

FIG. 4E shows a third embodiment of electrical circuit 241 or electrical circuit 242 that connects FBARs 311, 313 and 315 in series and additionally connects FBAR 317 and the series combination of FBARs 311, 313 and 315 in parallel between terminals T1 and T2. In this embodiment, the impedance between terminals T1 and T2 is $(3Z^2/4Z)=3Z/4$.

Figure 4F:
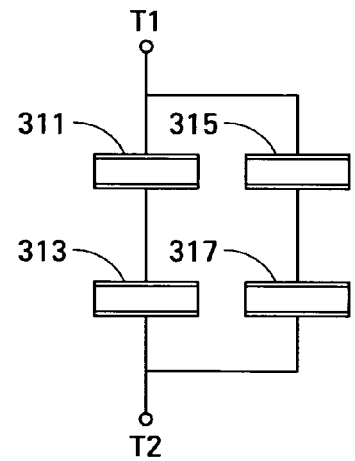

FIG. 4F shows a fourth embodiment of electrical circuit 241 or electrical circuit 242 that connects FBARs 311 and 313 in series, additionally connects FBARs 315 and 317 in series, and connects the series combination of FBARs 311 and 313 and the series combination of FBARs 315 and 317 in parallel between terminals T1 and T2. In this embodiment, the impedance between terminals T1 and T2 is $(4Z^2/4Z)=Z$.

Figure 4G:
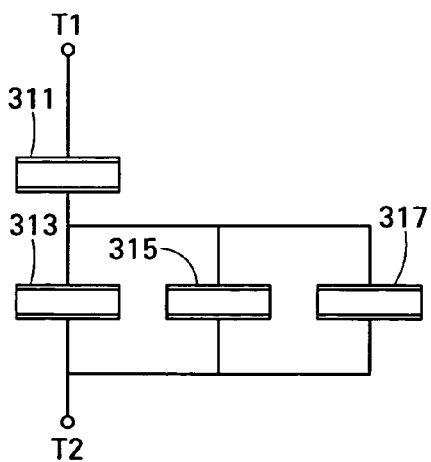

FIG. 4G shows a fifth embodiment of electrical circuit 241 or electrical circuit 242 that connects FBARs 313, 315 and 317 in parallel and additionally connects FBAR 311 and the parallel combination of series FBARs 313, 315 and 317 in series between terminals T1 and T2. In this embodiment, the impedance between terminals T1 and T2 is $Z+Z/3=4Z/3$.

Figure 4H:
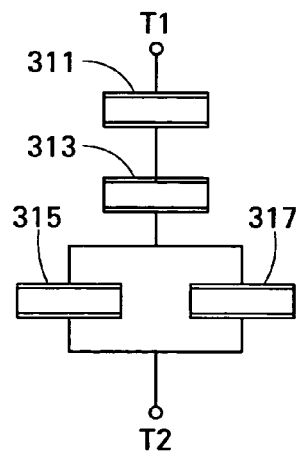

FIG. 4H shows a sixth embodiment of electrical circuit 241 or electrical circuit 242 that connects FBARs 315 and 317 in parallel and additionally connects FBARs 311 and 313 and the parallel combination of FBARs 315 and 317 in series between terminals T1 and T2. In this embodiment, the impedance between terminals T1 and T2 is $2Z+Z/2=5Z/2$.

Figure 4I:
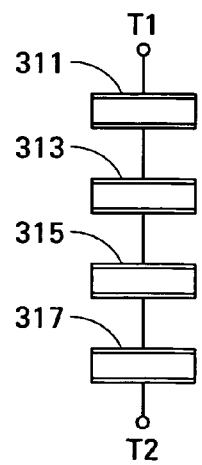

FIG. 4I shows a seventh embodiment of electrical circuit 241 or electrical circuit 242 that connects FBARs 311, 313, 315 and 317 in series between terminals T1 and T2. In this embodiment, the impedance between terminals T1 and T2 is 4Z. FIG. 4I illustrates the configuration in which electrical circuit 242 interconnects the upper FBARs 120 of DSBARs 206–208 in FIG. 4A.

Pairs of the embodiments of electrical circuits 241 and 242 described above with reference to FIGS. 4C–4I may be used in combination to provide embodiments of FACT 300 having 13 different impedance transformation ratios ranging from 1:1 to 1:16 between terminals 143 and 144 and terminals 145 and 146, as shown in Table 3. In counting the number of different impedance transformation ratios, ratios that are the inverse of one another, e.g., 1:16 and 16:1, are counted as a single ratio. However, the impedance transformation ratios are each provided at more than one impedance level. For example, an impedance transformation ratio of 10:3 (or 3:10) is provided at four different impedance levels of circuit 241, i.e., 2Z/5, 3Z/4, 4Z/3 and 5Z/2.

TABLE 3

| Cct. 241 imp. | Cct. 242 imp. | | | | | | |
|---|---|---|---|---|---|---|---|
| | ¼ (FIG. 4C) | ⅖ (FIG. 4D) | ¾ (FIG. 4E) | 1 (FIG. 4F) | 4/3 (FIG. 4G) | 5/2 (FIG. 4H) | 4 (FIG. 4I) |
| ¼ (FIG. 4C) | 1:1 | 8:5 | 3:1 | 4:1 | 16:3 | 10:1 | 16:1 |
| ⅖ (FIG. 4D) | 5:8 | 1:1 | 15:8 | 5:2 | 10:3 | 25:4 | 10:1 |
| ¾ (FIG. 4E) | 1:3 | 8:15 | 1:1 | 4:3 | 16:9 | 10:3 | 16:3 |
| 1 (FIG. 4F) | 1:4 | 2:5 | 3:4 | 1:1 | 4:3 | 5:2 | 4:1 |
| 4/3 (FIG. 4G) | 3:16 | 3:10 | 9:16 | 3:4 | 1:1 | 15:8 | 3:1 |
| 5/2 (FIG. 4H) | 1:10 | 4:25 | 3:10 | 2:5 | 8:15 | 1:1 | 8:5 |
| 4 (FIG. 4I) | 1:16 | 1:10 | 3:16 | 1:4 | 1:3 | 5:8 | 1:1 |

In Table 3, the row captions show the impedance of electrical circuit 241 between terminals 143 and 144 as a multiple of Z, the impedance of each of the FBARs 311, 313, 315 and 317, and the column captions show the impedance of electrical circuit 142 between terminals 145 and 146 as a multiple of Z, and the table entries show the impedance transformation ratio between the impedance and configuration of electrical circuit 241 indicated by the respective row caption and the impedance and configuration of electrical circuit 242 indicated by the respective column caption. The row captions and column captions additionally show the corresponding Figure number. The impedances shown in the row and column captions and the impedance transformation ratios shown in the body of the table are indicated by vulgar fractions since vulgar fractions characterize these quantities more accurately than decimals.

In making the combinations set forth in Table 3, upper FBARs above lower FBARs connected in parallel should be connected in anti-series, upper FBARs above lower FBARs connected in anti-parallel should connected in series, upper FBARs above lower FBARs connected in series should be connected in anti-parallel, and upper FBARs above lower FBARs connected in anti-series should connected in parallel, as described above.

Tables 2 and 3 show the various impedance transformation ratios that can be obtained using combinations of the embodiments of electrical circuits 241 and 242 shown in FIGS. 3C–3F and FIGS. 4C–4I, respectively. In an embodiment of a FACT with a given transformation ratio, a desired impedance between terminals 143 and 144, for example, is obtained by structuring the FBARs in terms of the area of their electrodes and the thickness and dielectric constant of their piezoelectric elements so that the series, parallel or series and parallel combination of the FBARs has the desired impedance. For example, in the configuration shown in FIG. 4C, a 50-ohm impedance between terminals 143 and 144 is obtained by structuring each of the FBARs of DSBARs 206–209 to have an impedance of 200 ohms.

Figure 6A:
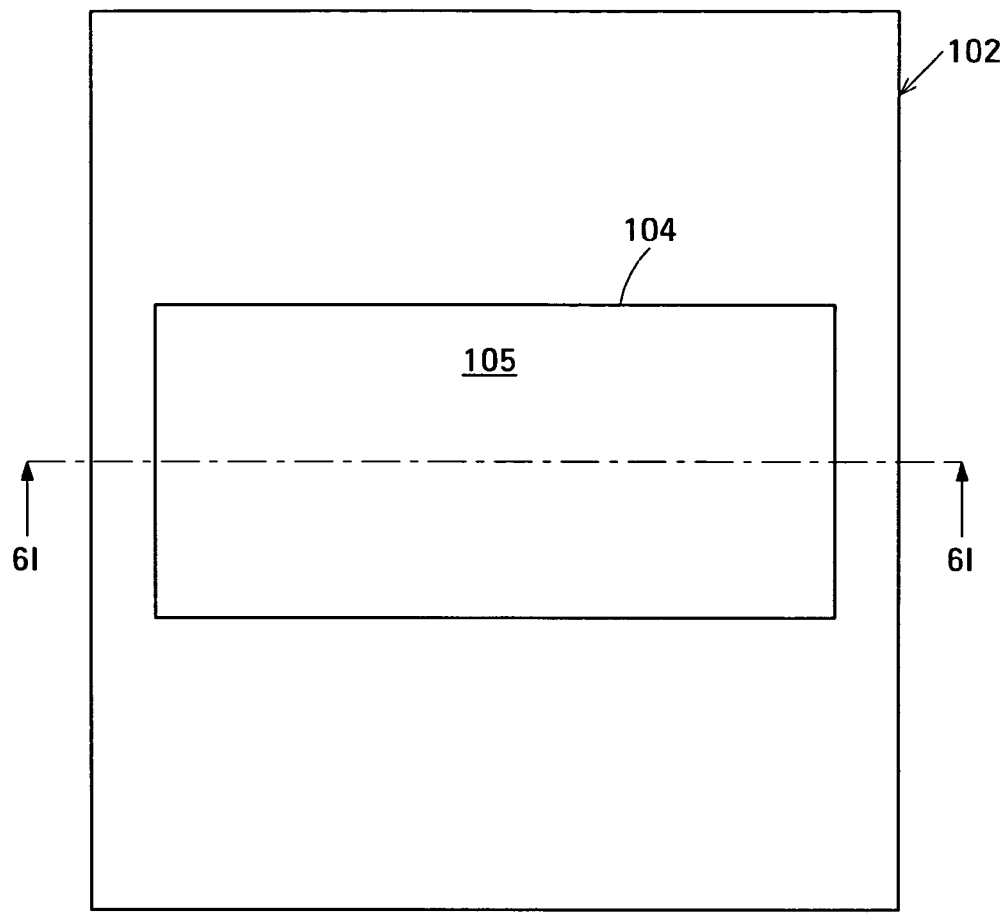
FIGS. 6A–6H are plan views and FIGS. 6I–6P are cross-sectional views along the section lines 6I—6I through 6P—6P in FIGS. 6A–6H, respectively, illustrating a process that may be used to fabricate embodiments of the FACT in accordance with the invention.
Figure 6I:
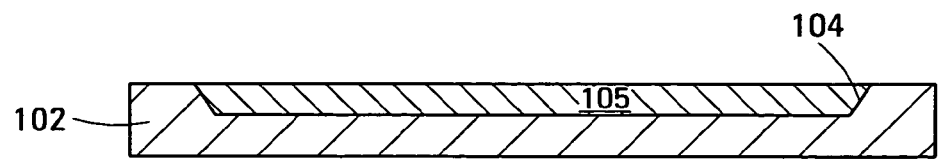
Figure 6B:
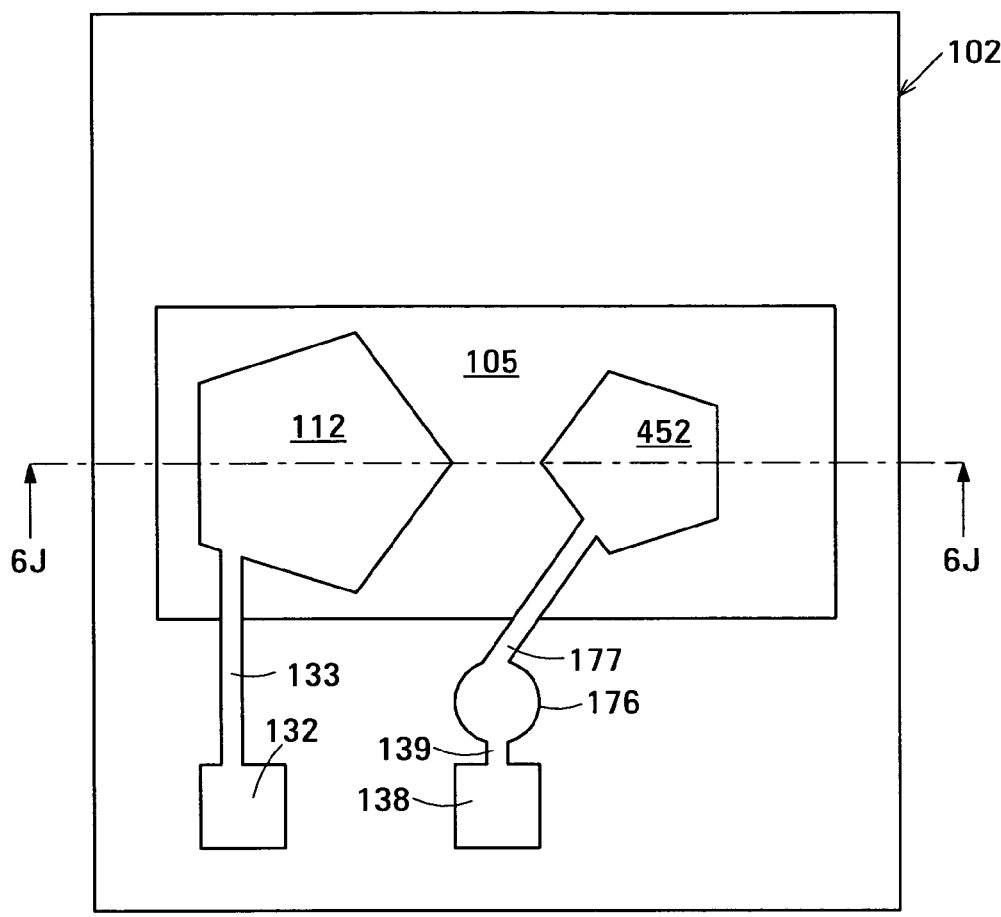
Figure 6J:
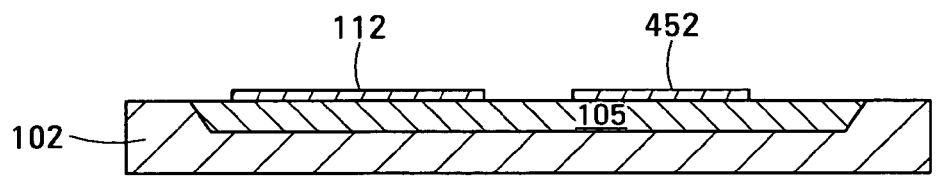

Embodiments of FACTs 200, 202, 300 and 302 may be fabricated using the method described below with reference to FIGS. 6A–6P but with different masks. In such a process, the different masks define three or four equal-area electrodes in each of the first through fourth metal layers. Common layers of piezoelectric material are typically used to provide the piezoelectric elements 116 and the piezoelectric elements 126 of all the DSBARs 206–208 or DSBARs 206–209. Alternatively, the DSBARs may have individual piezoelectric elements. Similarly, a common acoustic decoupling layer is used to provide the acoustic decouplers 130 of all the DSBARs 206–208 or DSBARs 206–209. Again, the DSBARs may alternatively have individual acoustic decouplers.

It will be apparent that DSBARs numbering more than four can be interconnected in a progressively-increasing number of series and parallel combinations to provide embodiments of a FACT having certain discrete impedance transformation ratios in the range from 1:1 to 1:m$^2$, where m is the number of DSBARs. The FBARs of the DSBARs are interconnected in series and parallel combinations in a manner similar to the FBARs of the three- and four-DSBAR embodiments exemplified above.

The FACT embodiments described above have constituent FBARs that all have the same capacitance and, hence, impedance. The FBARs typically have equal capacitance as a result of their electrodes being equal in area and their piezoelectric elements being equal in thickness. However, this is not critical to this aspect of the invention. FBARs in which their piezoelectric elements differ in either or both of thickness and dielectric constant and/or in which their electrodes differ in area may nevertheless be equal in capacitance provided differences in one or more capacitance-determining parameters are offset by corresponding differences in one or more other capacitance-determining parameters. However, the electrodes of the FBARs of each DSBAR should be equal in area to maximize coupling of energy in the DSBAR.

Some applications need an embodiment of a FACT with an impedance transformation ratio that differs from the discrete impedance transformation ratios provided by the embodiments exemplified above. Moreover, some of such applications additionally need, and other applications need, an embodiment of a FACT that is simpler in construction than the above-described embodiments composed of three or more DSBARs.

A second aspect of the invention provides such a film acoustically-coupled transformer (FACT). The inventors have discovered that embodiments of a two-DSBAR FACT with any impedance transformation ratio in the range from 1:4 to about 10:1 can be made by making the FBARs differ in capacitance, and, hence, in impedance, between the DSBARs. Stray capacitance is a major factor in determining the upper end of the range. FBARs that differ in capacitance between the DSBARs are typically made by making the FBAR electrodes differ in area between the DSBARs. Alternatively, but less conveniently, FBARs that differ in capacitance between the DSBARs may be made by making the piezoelectric elements differ in either or both of the thickness and dielectric constant between the DSBARs. Generally, an m-DSBAR FACT with any impedance transformation ratio in the range from 1:m to about 1:10, can be made by making the FBARs differ in capacitance, and, hence, in impedance, among the DSBARs.

Figure 5A:
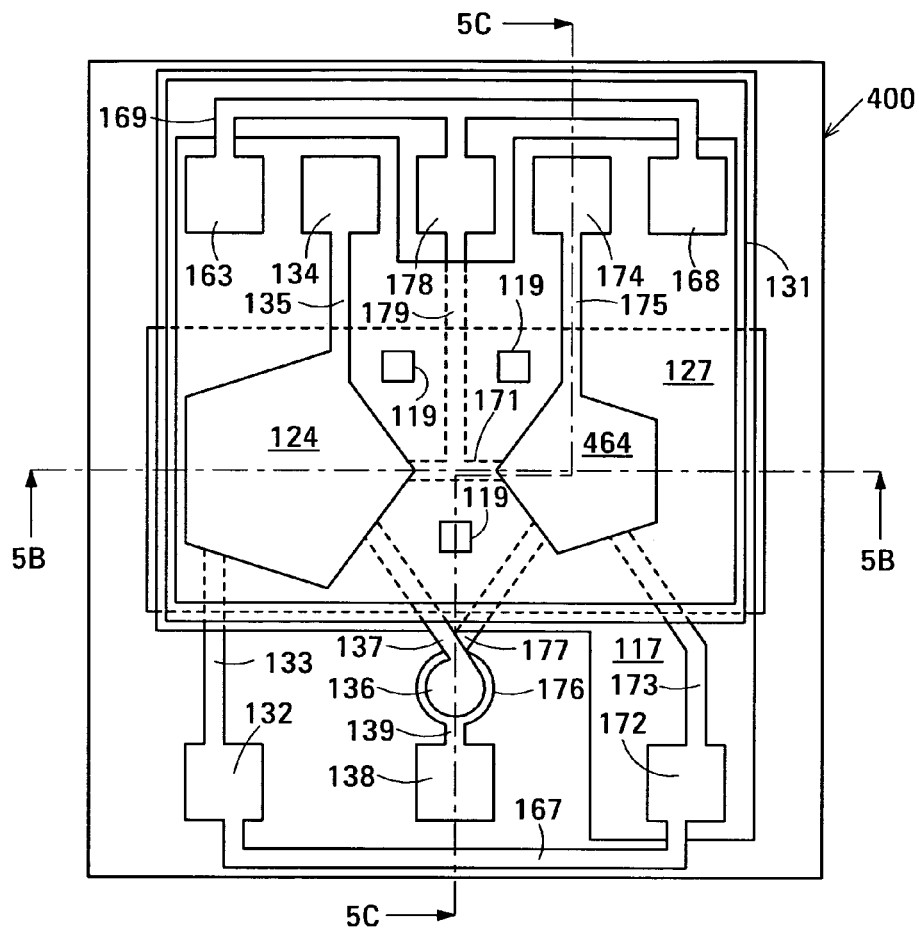
FIGS. 5A, 5B and 5C are respectively a plan view and cross-sectional views along the section lines 5B—5B and 5C—5C in FIG. 5A of a FACT in accordance with the invention in which the FBARs of one of the DSBARs differ in the area of their electrodes, and, hence, in impedance from the FBARs of the other of the DSBARs to define the impedance transformation ratio of the FACT.
Figure 5B:
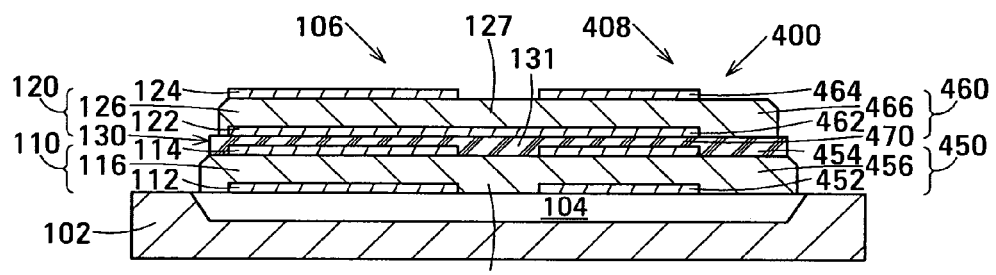
Figure 5C:
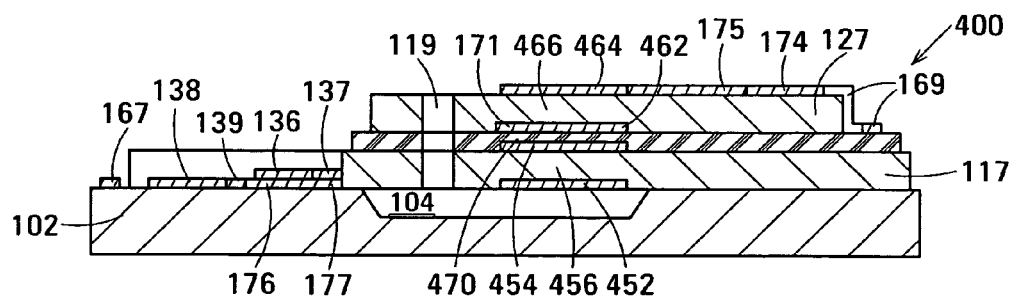
Figure 5D:
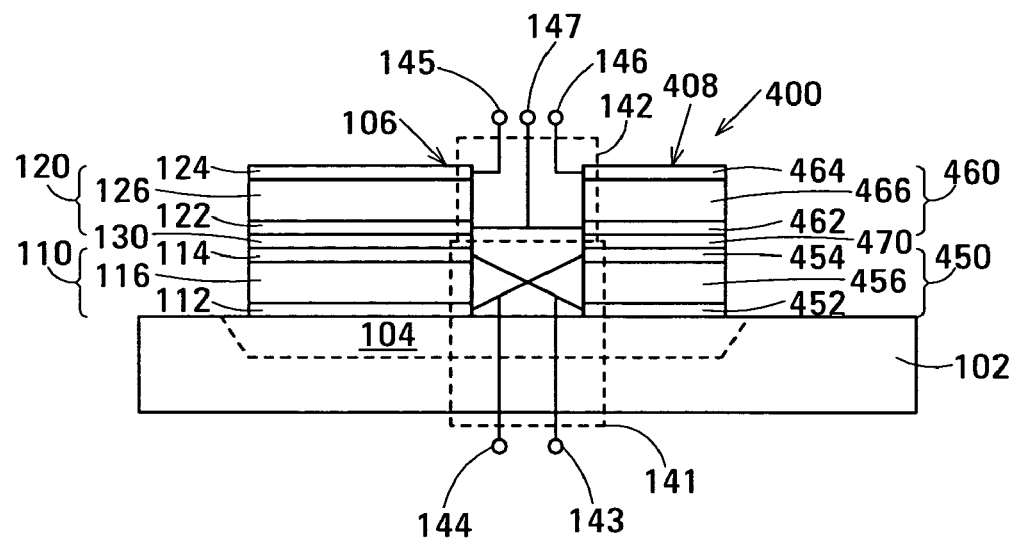
FIG. 5E is a cross-sectional view of a FACT in accordance with the invention in which the FBARs of one of the DSBARs differ in the thickness of their piezoelectric elements and, hence, in impedance, from the FBARs of the other of the DSBARs to define the impedance transformation ratio of the FACT.

FIGS. 5A–5C are respectively a plan view and two cross-sectional views of an embodiment 400 of a two-DSBAR film acoustically-coupled transformer (FACT) in which the FBARs differ in capacitance between the DSBARs to define the impedance transformation ratio of the FACT. FIG. 5D is an electrical schematic of FACT 400.

FACT 400 is composed of stacked bulk acoustic resonators (DSBARs) 106 and 408 suspended over a cavity 104 in a substrate 102. Each DSBAR is composed of a lower film bulk acoustic resonator (FBAR), an upper FBAR stacked on the lower FBAR, and an acoustic decoupler between the FBARs. FACT 400 is additionally composed of an electrical circuit 141 that interconnects the lower FBAR 110 of DSBAR 106 and the lower FBAR 450 of DSBAR 408, and an electrical circuit 142 that interconnects connects the upper FBAR 120 of DSBAR 106 to the upper FBAR 460 of DSBAR 408.

In DSBAR 106, lower FBAR 110 is composed of opposed planar electrodes 112 and 114 and a piezoelectric element 116 between the electrodes, and upper FBAR 120 is composed of opposed planar electrodes 122 and 124 and a piezoelectric element 126 between the electrodes. In DSBAR 408, lower FBAR 450 is composed of opposed planar electrodes 452 and 454 and a piezoelectric element 456 between the electrodes, and upper FBAR 460 is composed of opposed planar electrodes 462 and 464 and a piezoelectric element 466 between the electrodes.

In FACT 400, electrodes 452, 454, 462 and 464 of DSBAR 408 differ in area from electrodes 112, 114, 122 and 124 of DSBAR 106. Consequently, FBARs 450 and 460 of DSBAR 408 differ in capacitance and, hence, in impedance, from FBARs 110 and 120 of DSBAR 106. FACT 400 has an impedance transformation ratio of $(r+1)^2/r$, where r is the ratio of the impedance of FBARs 110 and 120 of DSBAR 106 to the impedance of FBARs 450 and 460 of DSBAR 408. In the example shown, the ratio r is also the ratio of the area of electrodes 112, 114, 122 and 124 to the area of electrodes 452, 454, 462 and 464. In the example shown, an impedance ratio, and, hence, area ratio, of 2:1 gives an impedance transformation ratio of 4.5. As before, the impedance of FACT 400 between terminals 143 and 144 depends on the parallel capacitance of lower FBARs 110 and 450 and the impedance of FACT 400 between terminals 145 and 146 depends on the series capacitance of upper DSBARs 120 and 460.

In FACT 400, in DSBAR 106, acoustic decoupler 130 is located between lower FBAR 110 and upper FBAR 120; specifically, between electrode 114 of lower FBAR 110 and electrode 122 of upper FBAR 120. Additionally, in DSBAR 408, acoustic decoupler 470 is located between FBARs 450 and 460; specifically, between electrode 454 of lower FBAR 450 and electrode 462 of upper FBAR 460. The coupling of acoustic energy defined by acoustic decouplers 130 and 470 determines the bandwidth of the passband of FACT 400.

In the example shown in FIGS. 5A–5C, acoustic decouplers 130 and 470 are respective parts of an acoustic decoupling layer 131. Acoustic decouplers 130 and 470 are each similar to acoustic decoupler 130 described above with reference to FIGS. 2A–2C and will not be described again here. Exemplary acoustic decoupling materials of acoustic decoupling layer 131 that provides acoustic decouplers 130 and 470 in the example shown in FIGS. 5A–5C and alternative acoustic decoupling materials are also described above and will not be described again. Acoustic decoupler 470 may also incorporate the alternative acoustic decoupler structure described above.

Embodiments of FACT 400 incorporating an embodiment of acoustic decoupling layer 131 in which the nominal value of integer p is zero ($t=\lambda_n/4$) have a frequency response substantially closer to an ideal frequency response than embodiments in which the acoustic decoupling layer has a nominal thickness greater than $\lambda_n/4$ (p>0). The frequency response of embodiments of the FACT in which the nominal thickness of the acoustic decoupling layer is $\lambda_n/4$ lacks spurious response artifacts exhibited by embodiments in which the nominal thickness of the acoustic decoupling layer is greater than $\lambda_n/4$. A smooth frequency response has hitherto been obtained at the expense of the parasitic capacitor composed of electrodes 114 and 122 and acoustic decoupler 130 having a substantially greater capacitance, and embodiments having a smooth frequency response have therefore typically had a low common-mode rejection ratio caused by this capacitance. In embodiments in which a high common-mode rejection ratio is important, an inductor, or an inductor in series with a blocking capacitor, can be connected in parallel with the parasitic capacitance to cancel most of the effect of the high parasitic capacitance resulting from a thin acoustic decoupling layer. The use of an inductor, or an inductor in series with a blocking capacitor, to cancel the effects of the parasitic capacitance is disclosed in the above-mentioned U.S. patent application Ser. No. 10/965,586 of John D. Larson III et al. entitled *Film Acoustically-Coupled Transformer With Increased Common Mode Rejection*. Thus, embodiments of FACT 400 can have both a high CMRR and the smooth frequency response provided by the $\lambda_n/4$-thick acoustic decoupling layer.

DSBAR 106 and DSBAR 408 are located adjacent one another suspended over cavity 104 defined in a substrate 102. Suspending the DSBARs over a cavity allows the stacked FBARs in each DSBAR to resonate mechanically. Other suspension schemes that allow the stacked FBARs to resonate mechanically are possible. For example, the DSBARs can be located over a mismatched acoustic Bragg reflector (not shown) formed in or on substrate 102, as disclosed by Lakin in U.S. Pat. No. 6,107,721.

FIG. 5D schematically illustrates the electrical interconnections of FACT 400. Referring additionally to FIG. 5A, a bonding pad 138 located on the major surface of substrate 102 provides the signal terminal 143 of electrical circuit 141 of FACT 400. A bonding pad 132 located on the major surface of substrate 102 and a bonding pad 172 located on the major surface of piezoelectric layer 117 that provides piezoelectric elements 116 and 156 collectively constitute the ground terminal 144 of electrical circuit 141. An interconnection pad 176 located on the major surface of the substrate, an electrical trace 177 extending from electrode 452 to interconnection pad 176, an interconnection pad 136 in electrical contact with interconnection pad 176, an electrical trace 137 extending from electrode 114 to interconnection pad 136, and an electrical trace 139 extending from interconnection pad 176 to bonding pad 138 constitute the part of electrical circuit 141 that electrically connects electrode 114 of FBAR 110 to electrode 452 of FBAR 450 and to signal terminal 143. Electrical trace 133 extending from electrode 112 to bonding pad 132, electrical trace 167 extending from bonding pad 132 to bonding pad 172 and electrical trace 173 extending from electrode 454 to bonding pad 172 constitute the part of electrical circuit 141 that electrically connects electrode 112 of FBAR 110 to electrode 454 of FBAR 450.

Bonding pad 134 and bonding pad 174 located on the major surface of the piezoelectric layer 127 that provides piezoelectric elements 126 and 466 constitute signal terminals 145 and 146 of electrical circuit 142. Bonding pad 178 located on the major surface of acoustic decoupling layer 131 constitutes center-tap terminal 147 of electrical circuit 142. Bonding pads 163 and 168 located on the major surface of piezoelectric layer 127 provide additional ground connections.

An electrical trace 171 that extends between electrode 122 and electrode 462 over the surface of the acoustic decoupling layer 131 and an electrical trace 179 that extends between electrical trace 171 and bonding pad 178 constitute the part of electrical circuit 142 that connects FBAR 120 and FBAR 460 in series and to center-tap terminal 147. An electrical trace 135 that extends between electrode 124 and bonding pad 134 and an electrical trace 175 that extends between electrode 454 and bonding pad 174 constitute the part of electrical circuit 142 that connects FBAR 120 and FBAR 460 to signal terminals 145 and 146. Electrical trace 169 extends between bonding pad 163 and bonding pad 168 that provide the ground terminals of electrical circuit 142. In this embodiment electrical trace 169 additionally extends to bonding pad 178 to connect center tap terminal 147 to the ground of electrical circuit 142.

Figure 5E:
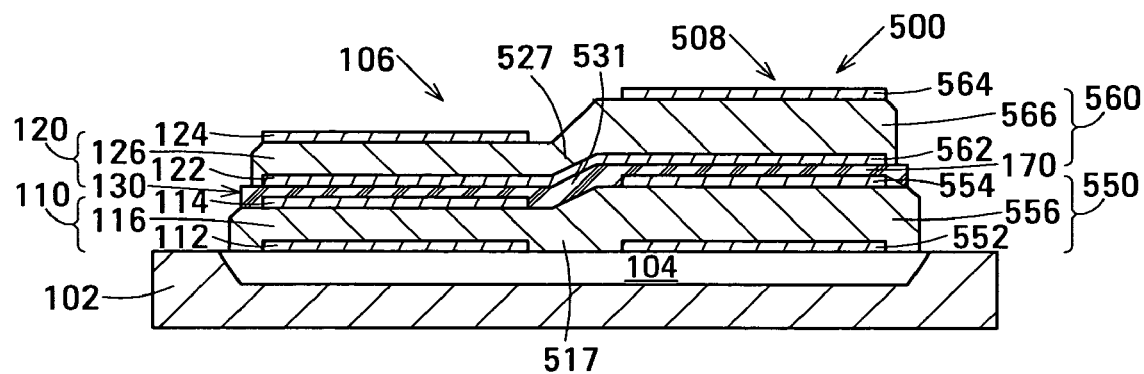

FIG. 5E is a cross-sectional views of an embodiment 500 of a two-DSBAR film acoustically-coupled transformer (FACT) in which the FBARs differ between the DSBARs in the thickness of their piezoelectric elements and, hence, in their capacitance to define the impedance transformation ratio of the FACT. FACT 500 has an electrical circuit similar to that described above with reference to FIG. 5D.

FACT 500 is composed of stacked bulk acoustic resonators (DSBARs) 106 and 508 suspended over a cavity 104 in a substrate 102. Each DSBAR is composed of a lower film bulk acoustic resonator (FBAR), an upper FBAR stacked on the lower FBAR, and an acoustic decoupler between the FBARs. FACT 500 is additionally composed of an electrical circuit 141 that interconnects the lower FBAR 110 of DSBAR 106 and the lower FBAR 550 of DSBAR 408, and an electrical circuit 142 that interconnects connects the upper FBAR 120 of DSBAR 106 to the upper FBAR 560 of DSBAR 508.

The structure of DSBAR 106 is described above with reference to FIGS. 5A–5C. In DSBAR 508, lower FBAR 550 is composed of opposed planar electrodes 552 and 554 and a piezoelectric element 556 between the electrodes, and upper FBAR 560 is composed of opposed planar electrodes 562 and 564 and a piezoelectric element 566 between the electrodes.

In FACT 500, the electrodes 152, 154, 162 and 164 of DSBAR 508 are equal in area to one another and to the electrodes 112, 114, 122, 124 of DSBAR 106, but piezoelectric elements 556 and 566 of DSBAR 508 differ in thickness from piezoelectric elements 116 and 126 of DSBAR 106. Consequently, FBARs 550 and 560 of DSBAR 508 differ in capacitance and, hence, in impedance, from FBARs 110 and 120 of DSBAR 106. FACT 500 has an impedance transformation ratio of $(r+1)^2/r$, where r is the ratio of the impedance of FBARs 110 and 120 of DSBAR 106 to the impedance of FBARs 550 and 560 of DSBAR 508. In the example shown, the ratio r is also the ratio of the thickness of piezoelectric elements 116 and 126 to the thickness of piezoelectric elements 556 566. In the example shown, the thickness ratio, and, hence, the impedance ratio is about 2:1, which gives an impedance transformation ratio of 4.5. As before, the impedance of FACT 500 between terminals 143 and 144 (FIG. 5D) depends on the parallel capacitance of lower FBARs 110 and 550 and the impedance of FACT 500 between terminals 145 and 146 (FIG. 5D) depends on the series capacitance of upper DSBARs 120 and 560.

In FACT 500, the acoustic decoupler 130 of DSBAR 106 is described above with reference to FIGS. 5A–5C and the acoustic decoupler 570 is similar to the acoustic decoupler 470 described above with reference to FIGS. 5A–5C and will therefore not be described again here. In the example shown in FIG. 5E, acoustic decouplers 130 and 570 are respective parts of an acoustic decoupling layer 531 in a manner similar to that described above with reference to FIGS. 5A–5C. Acoustic decouplers 130 and 570 may alternatively be independent of one another.

In the example shown, piezoelectric elements 116 and 556 are respective portions of a layer 517 of piezoelectric material that differs in thickness between FBARs 110 and 550. Similarly, piezoelectric elements 126 and 566 are respective portions of a layer 527 of piezoelectric material that differs in thickness between FBARs 120 and 560. Alternatively, piezoelectric elements 116, 126, 556 and 566 may be independent of one another.

DSBAR 106 and DSBAR 508 are located adjacent one another suspended over cavity 104 defined in a substrate 102 in a manner similar to that described above with reference to FIGS. 5A–5C.

In embodiments of FACT 200 described above with reference to FIGS. 3A–3F and of FACT 300 described above with reference to FIGS. 4A–4I, at least two of DSBARs 206–208 and at least two of DSBARs 206–209 may differ in the impedance of their FBARs in a manner similar to the above-described manner in which DSBARs 106 and 408 described above with reference to FIGS. 5A–5C differ in the impedance of their FBAR, or in the manner in which DSBARs 106 and 508 described above with reference to FIG. 5E differ in the impedance of their FBARs. Such differences in the impedances of the FBARs among two or more of the DSBARs can be used to provide the embodiment with a desired impedance transformation ratio different from the impedance transformation ratio that results when the FBARs are all equal in impedance.

A process that can be used to fabricate film acoustically-coupled transformer (FACT) 400 described above with reference to FIGS. 5A–5C will be described next with reference to the plan views of FIGS. 6A–6H and the cross-sectional views of FIGS. 6I–6P. The pass band of the embodiment of FACT 400 whose fabrication will be described has a nominal center frequency of about 1.9 GHz. Embodiments for operation at other frequencies are similar in structure and fabrication but have thicknesses and lateral dimensions different from those exemplified below. Moreover, with different masks, the process may also be used to fabricate embodiments of the three-DSBAR FACT 200 described above with reference to FIGS. 3A–3F and of the four-DSBAR FACT 300 described above with reference to FIGS. 4A–4I. Thousands of FACTs similar to FACT 400 are fabricated at a time by wafer-scale fabrication. Such wafer-scale fabrication makes the FACTs inexpensive to fabricate.

A wafer of single-crystal silicon is provided. A portion of the wafer constitutes, for each FACT being fabricated, a substrate corresponding to the substrate 102 of FACT 400. FIGS. 6A–6H and FIGS. 6I–6P illustrate, and the following description describes, the fabrication of FACT 400 in and on a portion of the wafer. As FACT 400 is fabricated, the other FACTs on the wafer are similarly fabricated.

The portion of the wafer that constitutes the substrate 102 of FACT 400 is selectively wet etched to form a cavity. A layer of fill material (not shown) is deposited on the surface of the wafer with a thickness sufficient to fill the cavity. The surface of the wafer is then planarized, leaving the cavity filled with fill material. FIGS. 6A and 6I show cavity 104 in substrate 102 filled with fill material 105.

In an embodiment, the fill material was phosphosilicate glass (PSG) and was deposited using conventional low-pressure chemical vapor deposition (LPCVD). The fill material may alternatively be deposited by sputtering or by spin coating.

A first metal layer is deposited on the surface of substrate 102 and fill material 105. The first metal layer is patterned as shown in FIGS. 6B and 6J to define electrode 112, electrode 452, bonding pad 132, bonding pad 138 and interconnection pad 176. The patterning also defines in the first metal layer electrical trace 133 extending between electrode 112 and bonding pad 132, electrical trace 177 extending between electrode 452 and interconnection pad 177, and electrical trace 139 extending between interconnection pad 176 and bonding pad 138.

Electrode 112 and electrode 452 typically have an asymmetrical shape in a plane parallel to the major surface of the wafer. An asymmetrical shape minimizes lateral modes in FBAR 110 and FBAR 450 (FIG. 2A) of which the electrodes form part. This is described in U.S. Pat. No. 6,215,375 of Larson III et al., the disclosure of which is incorporated into this disclosure by reference. Electrode 112 and electrode 452 leave part of the surface of fill material 105 exposed so that the fill material can later be removed by etching, as will be described below.

Referring additionally to FIG. 5D, electrodes 114 and 454 are defined in a second metal layer, electrodes 122 and 462 are defined in a third metal layer and electrodes 124 and 464 are defined in a fourth metal layer, as will be described below. The first through fourth metal layers in which the electrodes are define are patterned such that, in respective planes parallel to the major surface of the wafer, electrodes 112 and 114 of FBAR 110 have the same shape, size, orientation and position, electrodes 122 and 124 of FBAR 120 have the same shape, size, orientation and position, electrodes 452 and 454 of FBAR 450 have the same shape, size, orientation and position and electrodes 462 and 464 of FBAR 460 have the same shape, size, orientation and position. Typically, the metal layers are patterned such that electrodes 114 and 122 additionally have the same shape, size, orientation and position and electrodes 454 and 462 additionally have the same shape, size, orientation and position. In accordance with the invention, in the example shown, the metal layers are additionally patterned such that the electrodes 452, 454, 462 and 464 of the FBARs 110 and 120 of DSBAR 408 differ in area from the electrodes 112, 114, 122 and 124 of the FBARs 110 and 120 of DSBAR 106. The differing electrode areas makes the FBARs 450 and 460 of DSBAR 408 differ in capacitance, and, hence, in impedance, from the FBARs 110 and 120 of DSBAR 106.

In an embodiment, the material of each of the metal layers was molybdenum deposited by sputtering to a thickness of about 300 nm. The electrodes of DSBAR 106 defined in each of the metal layers were pentagonal each with an area of about 12,000 square µm and the electrodes of DSBAR 408 defined in each of the metal layers were pentagonal each with an area of about 6,000 square µm. This electrode area gives an area ratio of about 2.0 and an impedance transformation ratio of 1:4.5. Other electrode areas give other characteristic impedances and impedance transformation ratios.

Other refractory metals such as tungsten, niobium and titanium may alternatively be used as the material of the metal layers. The metal layers may each alternatively comprise layers of more than one material. One factor to be considered in choosing the material of the electrodes of FACT 400 is the acoustic properties of the electrode material: the acoustic properties of the material(s) of the remaining metal parts of FACT 400 are less important than other properties such as electrical conductivity. Thus, material(s) of the remaining metal parts of FACT 400 may be different from the material of the electrodes.

Figure 6C:
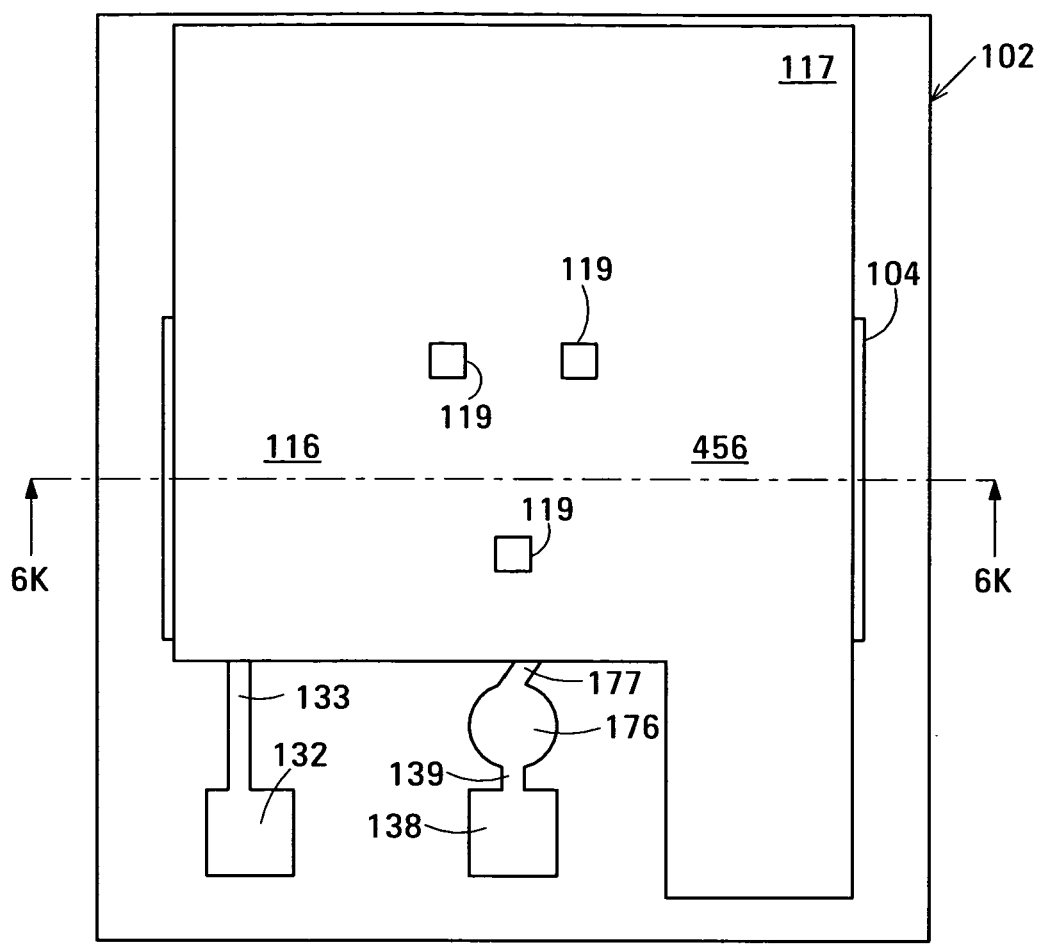
Figure 6K:
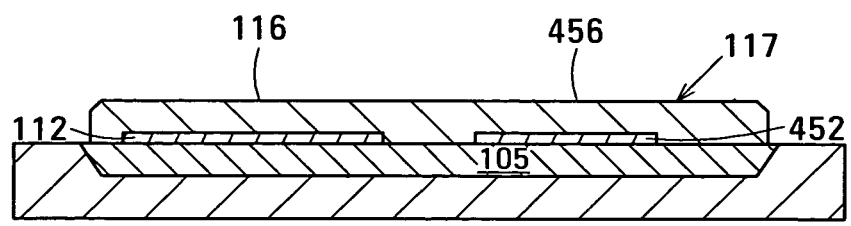

A layer of piezoelectric material is deposited and is patterned as shown in FIGS. 6C and 6K to define a piezoelectric layer 117 that provides piezoelectric element 116 of FBAR 110 and piezoelectric element 456 of FBAR 450. Piezoelectric layer 117 extends over substrate 102 beyond the extent of cavity 104. Piezoelectric layer 117 is patterned to expose part of the surface of fill material 105, bonding pads 132 and 138 and interconnection pad 176. Piezoelectric layer 117 is additionally patterned to define windows 119 that provide access to additional parts of the surface of the fill material.

In an embodiment, the piezoelectric material deposited to form piezoelectric layer 117 and piezoelectric layer 127 described below was aluminum nitride deposited by sputtering to a thickness of about 1.4 µm. The piezoelectric material was patterned by wet etching in potassium hydroxide or by chlorine-based dry etching. Alternative materials for the piezoelectric layers include zinc oxide, cadmium sulfide and poled ferroelectric materials such as perovskite ferroelectric materials, including lead zirconium titanate, lead meta niobate and barium titanate.

Figure 6D:
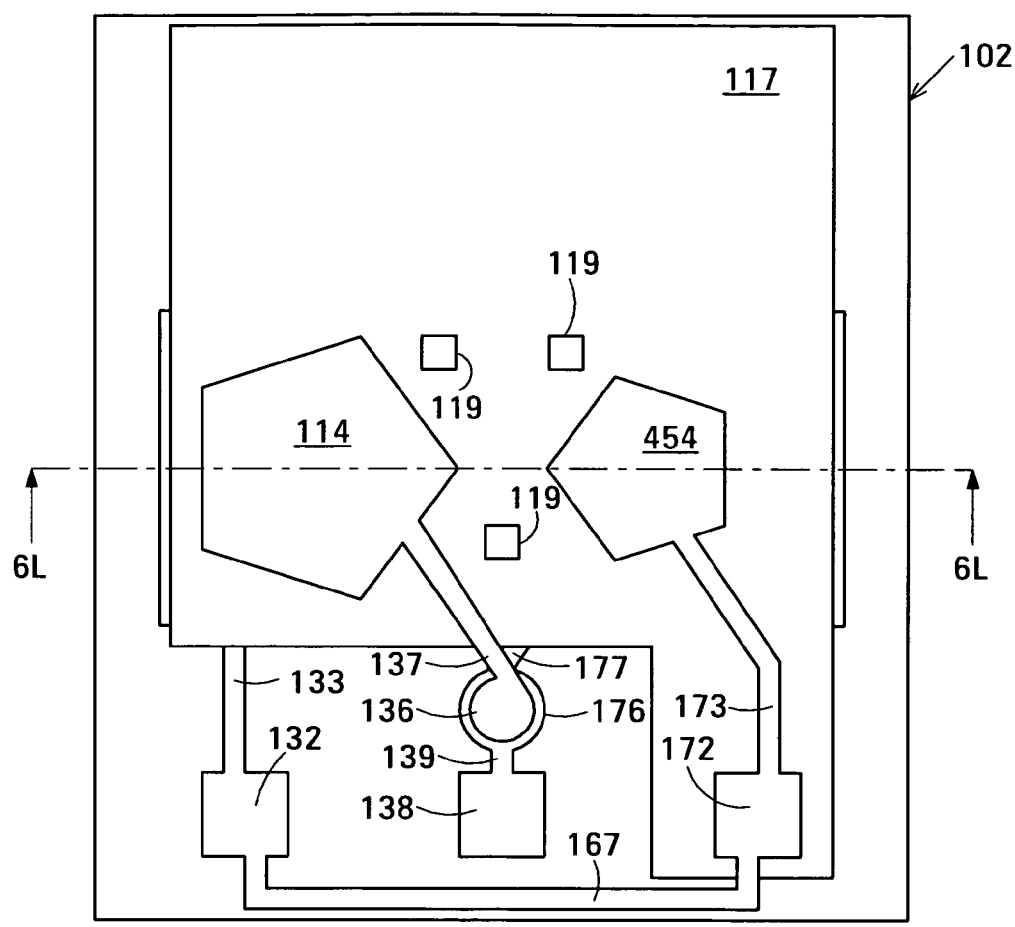
Figure 6L:
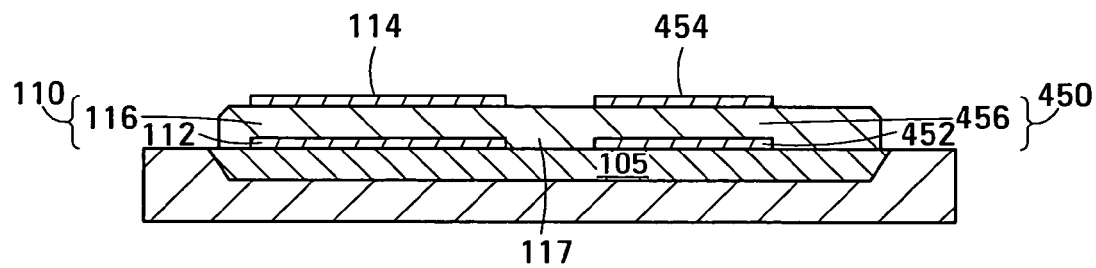

A second metal layer is deposited on piezoelectric layer 117 and is patterned as shown in FIGS. 6D and 6L to define electrode 114, electrode 454, bonding pad 172, and interconnection pad 136 in electrical contact with interconnection pad 176. The patterning additionally defines in the second metal layer electrical trace 137 extending between electrode 114 and interconnection pad 136, electrical trace 173 extending between electrode 454 and bonding pad 172, and electrical trace 167 extending between bonding pads 132 and 172.

Figure 6E:
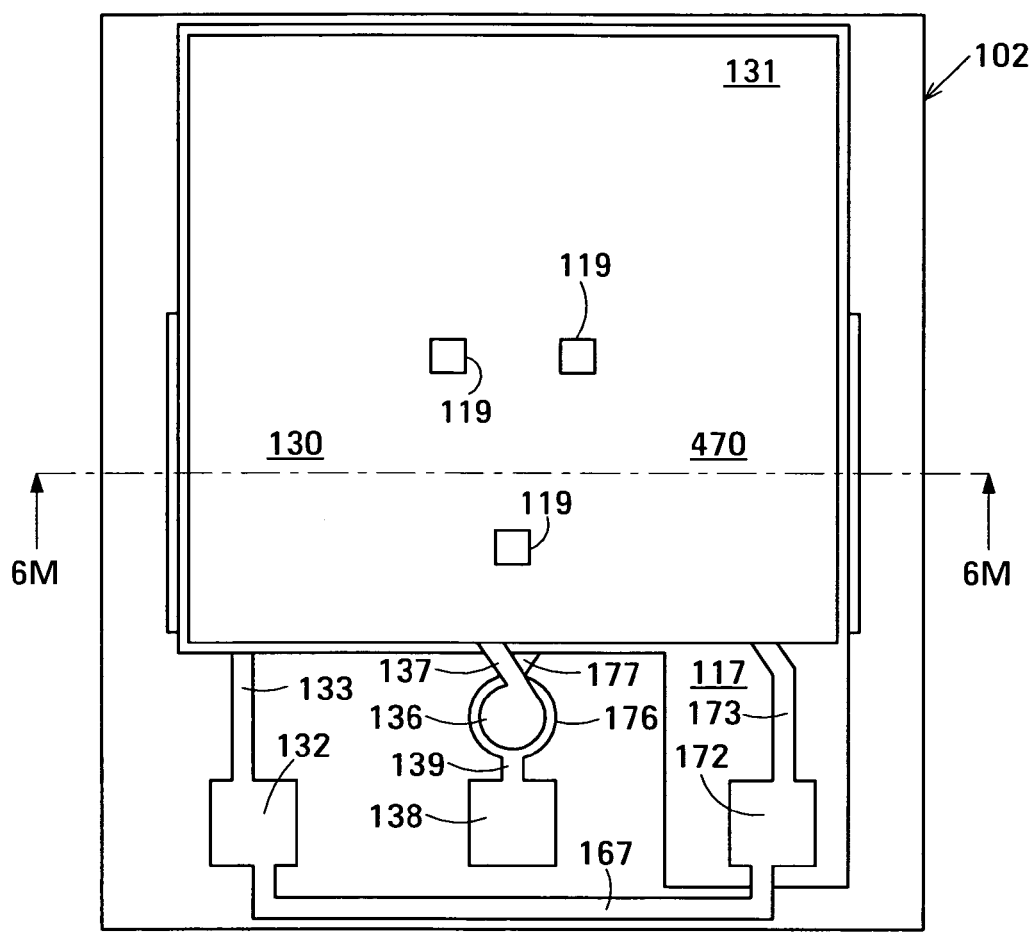
Figure 6M:
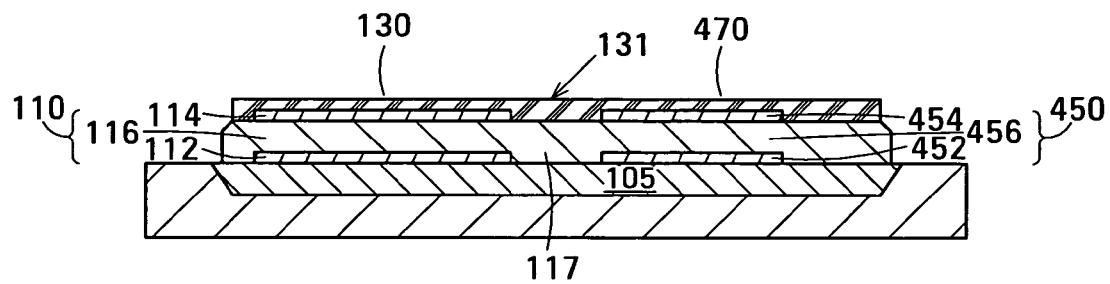

A layer of acoustic decoupling material is then deposited and is patterned as shown in FIGS. 6E and 6M to define acoustic decoupling layer 131 that provides acoustic decoupler 130 and acoustic decoupler 470. Acoustic decoupling layer 131 is patterned to cover at least electrode 114 and electrode 454, and to expose part of the surface of fill material 105, bonding pads 132, 138 and 172, and interconnection pads 136 and 176. Acoustic decoupling layer 131 is additionally patterned to define windows 119 that provide access to additional parts of the surface of the fill material.

In an embodiment, the acoustic decoupling material was polyimide with a thickness of about 200 nm, i.e., one quarter of the wavelength of a center frequency of about 1,900 MHz in the polyimide. The polyimide was deposited to form acoustic decoupling layer 131 by spin coating, and was patterned by photolithography. Polyimide is photosensitive so that no photoresist is needed. As noted above, other plastic materials can be used as the acoustic decoupling material. The acoustic decoupling material can be deposited by methods other than spin coating.

In an embodiment in which the acoustic decoupling material was polyimide, after depositing and patterning the polyimide, the wafer was baked initially at a temperature of about 250° C. in air and finally at a temperature of about 415° C. in an inert atmosphere, such as a nitrogen atmosphere, before further processing was performed. The bake evaporates volatile constituents of the polyimide and prevents the evaporation of such volatile constituents during subsequent processing from causing subsequently-deposited layers to separate.

Figure 6F:
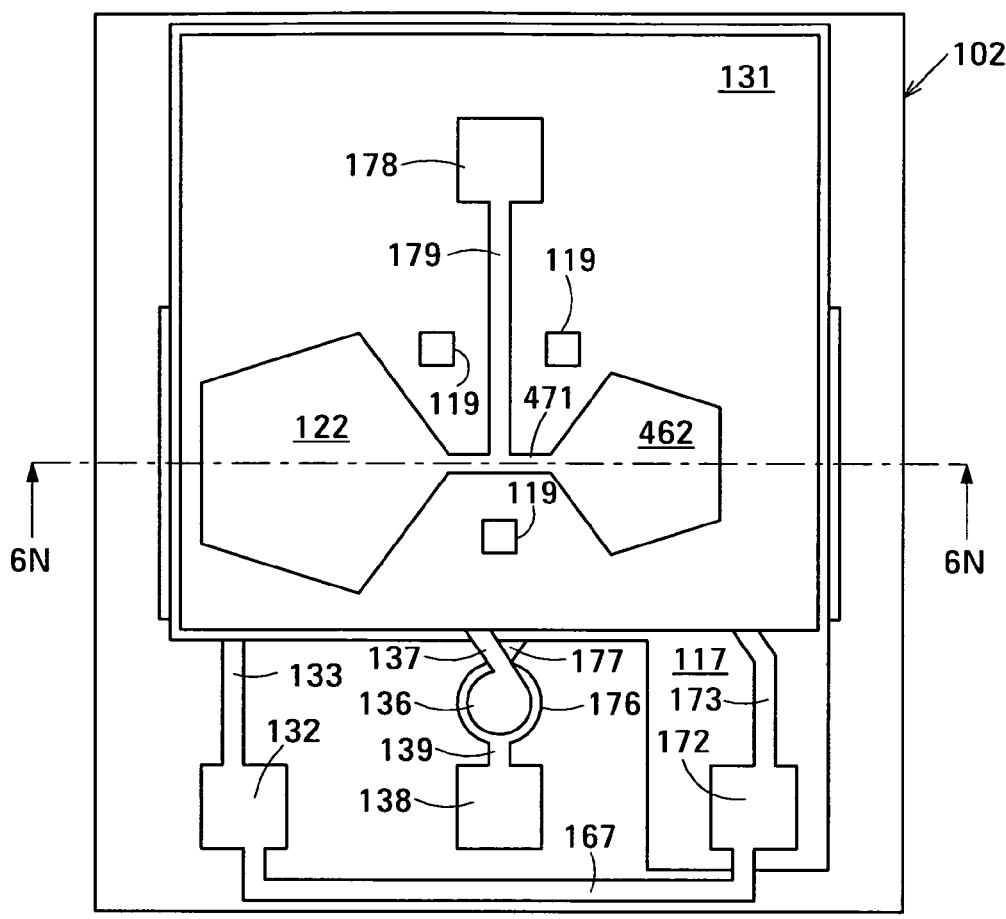
Figure 6N:
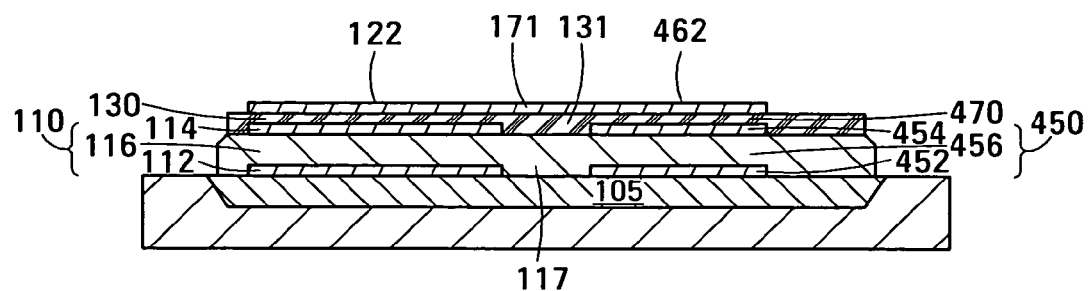

A third metal layer is deposited on acoustic decoupling layer 131 and is patterned as shown in FIGS. 6F and 6N to define electrode 122, electrode 462 and bonding pad 178. The patterning also defines in the third metal layer electrical trace 171 extending between electrode 122 and electrode 462, and electrical trace 179 extending between electrical trace 171 and bonding pad 178.

Figure 6G:
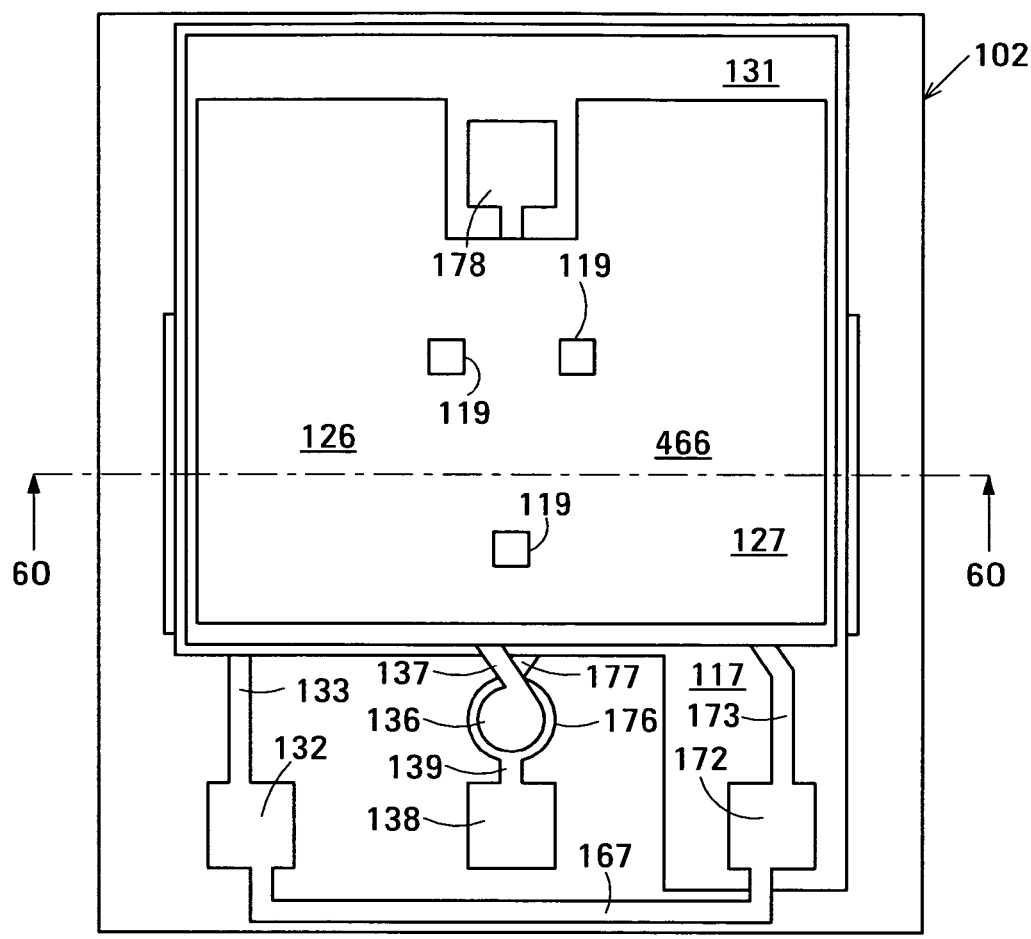
Figure 6O:
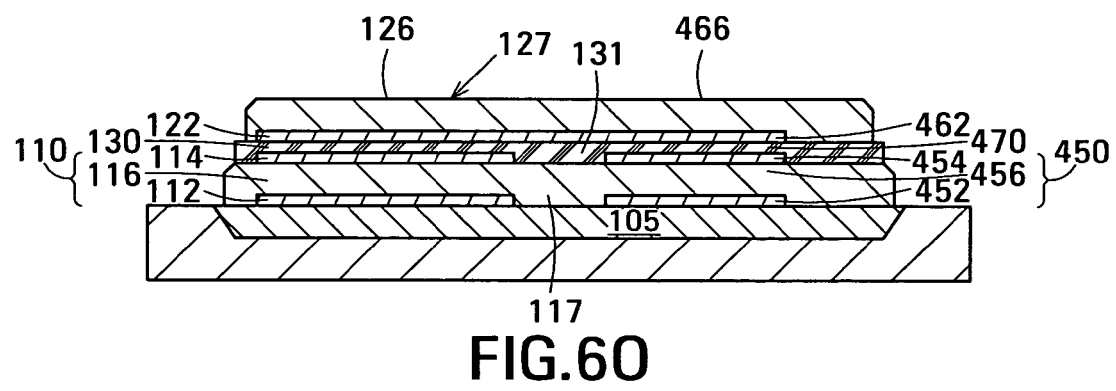

A layer of piezoelectric material is deposited and is patterned as shown in FIGS. 6G and 6O to define piezoelectric layer 127 that provides piezoelectric element 126 of FBAR 120 and piezoelectric element 466 of FBAR 460. Piezoelectric layer 127 is patterned to expose bonding pads 132, 138, 178 and 172, interconnection pads 136 and 176 and part of the surface of fill material 105. Piezoelectric layer 127 is additionally patterned to define the windows 119 that provide access to additional parts of the surface of the fill material.

Figure 6H:
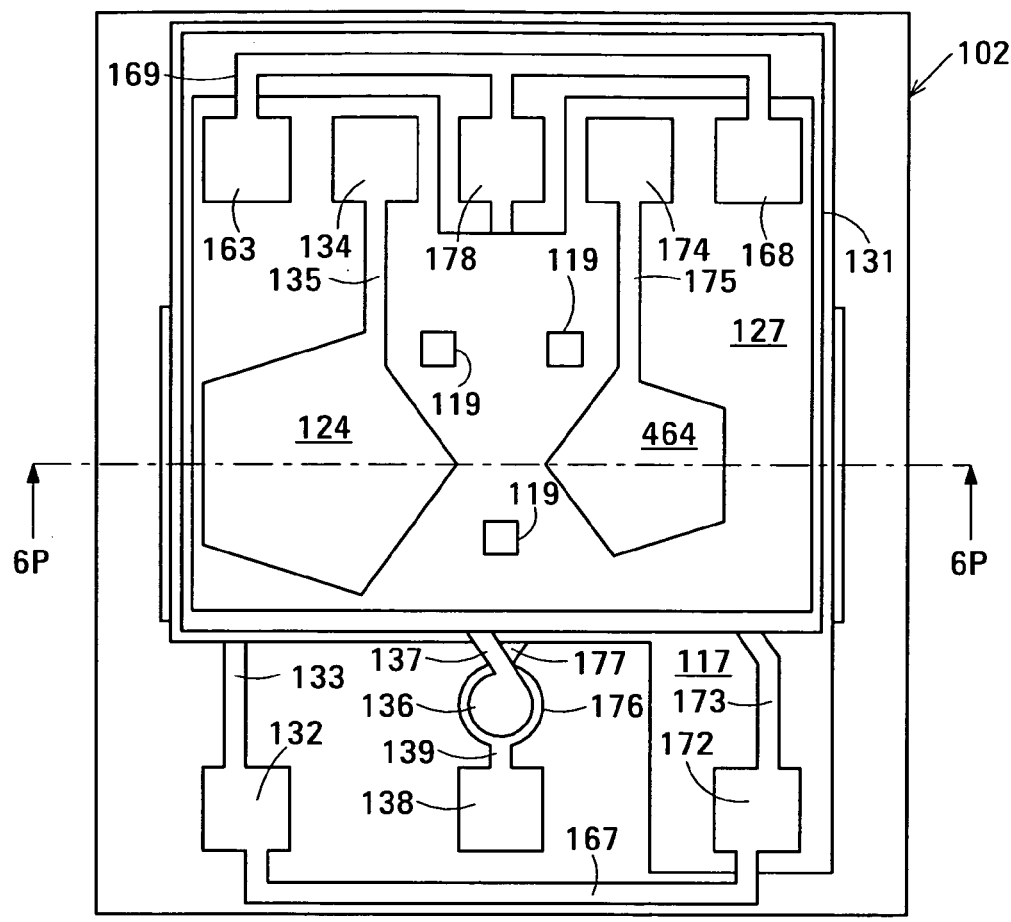
Figure 6P:
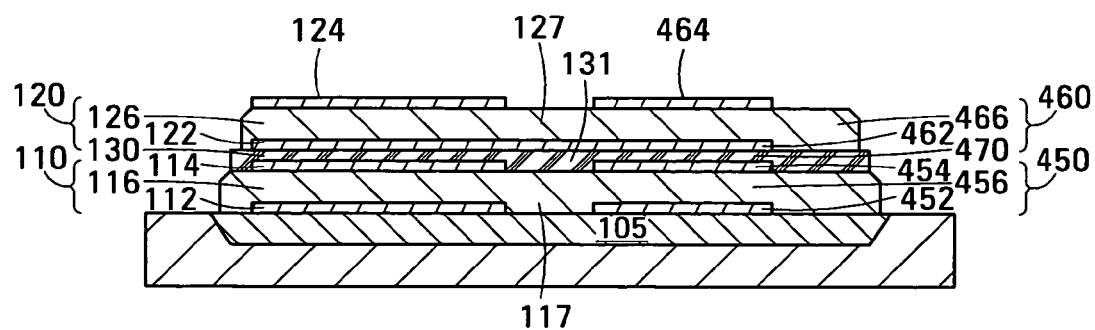

A fourth metal layer is deposited and is patterned as shown in FIGS. 6H and 6O to define electrode 124, electrode 464, bonding pad 163, bonding pad 134, bonding pad 174 and bonding pad 168. The patterning also defines in the fourth metal layer electrical trace 135 extending from electrode 124 to bonding pad 134, electrical trace 175 extending from electrode 464 to bonding pad 174, and electrical trace 169 extending from bonding pad 163 and bonding pad 168 to bonding pad 178.

The wafer is then isotropically wet etched to remove fill material 105 from cavity 104. As noted above, portions of the surface of fill material 105 remain exposed through, for example, windows 119. The etch process leaves FACT 400 suspended over cavity 104, as shown in FIGS. 5A and 5B.

In an embodiment, the etchant used to remove fill material 105 was dilute hydrofluoric acid.

A gold protective layer is deposited on the exposed surfaces of bonding pads 172, 138, 132, 163, 134, 178, 174 and 168.

The wafer is then divided into individual FACTs, including FACT 400. Each FACT is then mounted in a package and electrical connections are made between bonding pads 172, 132, 163, 134, 178, 174 and 168 of the FACT and pads that are part of the package.

In another embodiment, the acoustic decoupling material of acoustic decoupling layer 131 is a crosslinked polyphenylene polymer. After the second metal layer is patterned to define electrodes 114 and 454, as described above with reference to FIGS. 6D and 6L, the precursor solution for the crosslinked polyphenylene polymer is spun on in a manner similar to that described above with reference to FIGS. 6E and 6M, but is not patterned. The formulation of the crosslinked polyphenylene polymer and the spin speed are selected so that the crosslinked polyphenylene polymer a layer with a thickness of about 187 nm. This corresponds to one quarter of the wavelength $\lambda_n$ in the crosslinked polyphenylene polymer of an acoustic signal having a frequency equal to the center frequency of the pass band of FACT 400. The wafer is then baked at a temperature in the range from about 385° C. to about 450° C. in an inert ambient, such as under vacuum or in a nitrogen atmosphere, before further processing is performed. The bake first drives off the organic solvents from the precursor solution, and then causes the oligomer to cross link as described above to form the crosslinked polyphenylene polymer.

The third metal layer is then deposited on the layer of crosslinked polyphenylene polymer in a manner similar to that described above with reference to FIGS. 6F and 6N. However the third metal layer is initially patterned in a manner similar to that shown in FIGS. 6E and 6M to define a hard mask that will be used to pattern the layer of crosslinked polyphenylene polymer to define acoustic decoupling layer 131. The initially-patterned third metal layer has the same extent as acoustic decoupling layer 131 and has windows in the locations of windows 119 in acoustic decoupling layer 131.

The layer of crosslinked polyphenylene polymer is then patterned as shown in FIGS. 6E and 6M with the initially-patterned third metal layer as a hard etch mask. The patterning defines in the layer of crosslinked polyphenylene polymer the extent of acoustic decoupling layer 131 and windows 119 that provide access to additional parts of the surface of fill material 105. The patterning is performed with an oxygen plasma etch.

The third metal layer is then re-patterned as shown in FIGS. 6F and 6N to define electrode 122, electrode 462 and bonding pad 178. The re-patterning also defines in the third metal layer electrical trace 171 extending between electrode 122 and electrode 462, and electrical trace 179 extending between electrical trace 171 and bonding pad 178.

Fabrication of the embodiment of FACT 400 with an acoustic decoupling layer of a crosslinked polyphenylene polymer is completed by performing the processing described above with reference to FIGS. 6G, 6H, 6O and 6P.

In an embodiment, the precursor solution for the crosslinked polyphenylene polymer was one sold by The Dow Chemical Company and designated SiLK™ J. Alternatively, the precursor solution may be any suitable one of the precursor solutions sold by The Dow Chemical Company under the trademark SiLK. In certain embodiments, a layer of an adhesion promoter was deposited before the precursor solution was spun on. Precursor solutions containing oligomers that, when cured, form a crosslinked polyphenylene polymer having an acoustic impedance of about 2 Mrayl may be available from other suppliers now or in the future and may also be used.

An embodiment of FACT 500 described above with reference to FIG. 5E can be made using a variation on the processes described above. Electrodes 552, 554, 562 and 562 and electrodes 112, 114, 122, 124 are all equal in area. In such embodiment, piezoelectric material is deposited over electrodes 112 and 552 to a first thickness, and additional piezoelectric material is deposited over and adjacent electrode 552. The dual-thickness layer of piezoelectric material is then patterned as described above with reference to FIGS. 6C and 6K to define piezoelectric layer 517. Additionally, piezoelectric material is deposited over electrodes 122 and 562 to a first thickness, and additional piezoelectric material is deposited over and adjacent electrode 562. The dual-thickness layer of piezoelectric material is then patterned as described above with reference to FIGS. 6G and 6P to define piezoelectric layer 527. This makes piezoelectric elements 556 and 566 differ in thickness from piezoelectric elements 116 and 126, and the FBARs 550 and 560 of DSBAR 508 differ in capacitance, and, hence, in impedance, from the FBARs 110 and 120 of DSBAR 106. In a variation, electrodes 552, 554, 562 and 562 additionally differ in area from electrodes 112, 114, 122, 124 to further increase the difference in impedance between the FBARs of DSBAR 508 and the FBARs of DSBAR 106.

In another embodiment, electrodes 452, 454, 462 and 462 and electrodes 112, 114, 122, 124 are all equal in area. In such embodiment, a first piezoelectric material is deposited over electrode 112, and a second piezoelectric material is deposited over electrode 452. The piezoelectric materials differ in dielectric constant. The composite layer of piezoelectric material is then patterned as described above with reference to FIGS. 6C and 6K to define piezoelectric layer 117. Additionally, the first piezoelectric material is deposited over electrode 122, and the second piezoelectric material is deposited over electrode 462. The piezoelectric materials differ in dielectric constant. The composite layer of piezoelectric material is then patterned as described above with reference to FIGS. 6G and 6P to define piezoelectric layer 127. This makes piezoelectric elements 456 and 466 differ in dielectric constant from piezoelectric elements 116 and 126. Consequently, the FBARs 450 and 460 of DSBAR 408 differ in capacitance, and, hence, in impedance, from the FBARs 110 and 120 of DSBAR 106.

In a variation, electrodes 452, 454, 462 and 462 additionally differ in area from electrodes 112, 114, 122, 124 to further increase the difference in impedance between the FBARs of DSBAR 408 and the FBARs of DSBAR 106. In an additional or alternative variation, the first piezoelectric material differs in thickness from the second piezoelectric material to further increase the difference in impedance between the FBARs of DSBAR 408 and the FBARs of DSBAR 106.

This disclosure describes the invention in detail using illustrative embodiments. However, the invention defined by the appended claims is not limited to the precise embodiments described.

We claim:

1. A film acoustically-coupled transformer (FACT), comprising: decoupled stacked bulk acoustic resonators (DSBARs), each of the DSBARs comprising: a lower film bulk acoustic resonator (EBAR) and an upper FBAR, the upper FBAR stacked on the lower FBAR, each FBAR comprising opposed planar electrodes and a piezoelectric element between the electrodes, and an acoustic decoupler between the FBARs; a first electrical circuit interconnecting the lower FBARs; and a second electrical circuit interconnecting the upper FBARs; in which: the FBARs of one of the DSBARs differ in impedance from the FBARs of another of the DSBARs.

2. The FACT of claim 1, in which the electrodes of the FBARs of the one of the DSBARS differ in area from the electrodes of the FBARs of the other of the DSBARS.

3. The FACT of claim 1, in which the piezoelectric elements of the FBARs of the one of the DSBARs differ in thickness from the piezoelectric elements of the FBARs of the other of the DSBARS.

4. The FACT of claim 1, in which the piezo electric elements of the FBARs of the one of the DSBARs differ in dielectric constant from the piezoelectric elements of the FBARs of the other of the DSBARs.

5. The FACT of claim 1, in which: the first electrical circuit connects the lower FBARs in one of (a) series and (b) anti-parallel; and the second electrical circuit connects the upper FBARs in the other of (a) series and (b) anti-parallel.

6. The FACT of claim 1, in which the DSBARS are more than two in number.

7. The FACT of claim 1, in which: the FACT has a pass band having a center frequency, and each of the acoustic decouplers comprises a layer of acoustic decoupling material having a nominal thickness equal to one quarter of the wavelength in the acoustic decoupling material of an acoustic signal equal in frequency to the center frequency.

8. The FACT of claim 7, in which the acoustic decoupling material comprises one of polyimide, paralene and a crosslinked polyphenylene polymer.

9. The FACT of claim 1, in which: the FACT has a pass band having a center frequency; and each of the acoustic decouplers comprises layers of different acoustic decoupling materials and is structured to impose a nominal phase change of $\pi/2$ on an acoustic signal equal in frequency to the center frequency.

10. The FACT of claim 1, in which: the DSBARs are more than two in number and one of the electrical circuits provides series and parallel connections among the respective one of the lower FBARs and the upper FBARs.

11. The FACT of claim 1, in which the FACT has an impedance transformation ratio of $(1+r)^2/r$, where r is the ratio between the impedance of the FBARs of the one of the DSBARs and the impedance of the FBARs of the other of the DSBARs.

12. A film acoustically-coupled transformer (FACT), comprising: more than two decoupled stacked bulk acoustic resonators (DSBARs), each of the DSBARs comprising: a first film bulk acoustic resonator (FBAR) and a second FBAR, one of the FBARs stacked on the other of the FBARs, each FBAR comprising opposed planar electrodes and a piezoelectric element between the electrodes, and an acoustic decoupler between the FBARs; a first electrical circuit interconnecting the first FBARs of the DSBARs; and a second electrical circuit interconnecting the second FBARs of the DSBARS.

13. The FACT of claim 12, in which the first electrical circuit provides series and parallel connections among the first FBARs.

14. The FACT of claim 13, in which: the DSBARs comprise a first DSBAR, a second DSBAR and a third DSBAR; and the first electrical circuit connects the first FBAR of the first DSBAR and the first FBAR of the second DSBAR in series to form a series combination and connects the first FBAR of the third DSBAR in parallel with the series combination.

15. The FACT of claim 14, in which: the DSBARs additionally comprise a fourth DSBAR and the first electrical circuit additionally connects the first FBAR of the fourth DSBAR in parallel with the first FBAR of the third DSBAR and the series combination.

16. The FACT of claim 14, in which: the DSBARS additionally comprise a fourth DSBAR; and the first electrical circuit additionally connects the first FBAR of the fourth DSBAR in series with the first FBAR of the first DSBAR and the first FBAR of the second DSBAR to form the series combination.

17. The FACT of claim 14, in which: the DSBARs additionally comprise a fourth DSBAR and the first electrical circuit additionally connects the first FBAR of the fourth DSBAR in series with the first FBAR of the third DSBAR connected in parallel with the series combination.

18. The FACT of claim 13, in which: the DSBARs comprise a first DSBAR, a second DSBAR and a third DSBAR and the first electrical circuit connects the first FBAR of the first DSBAR and the first FBAR of the second DSBAR in parallel to form a parallel combination and connects the first FBAR of the third DSBAR in series with the parallel combination.

19. The FACT of claim 18, in which: the DSBARs additionally comprise a fourth DSBAR and the first electrical circuit additionally connects the first FBAR of the fourth DSBAR in parallel with the first FBAR of the first DSBAR and the first FBAR of the second DSBAR to form the parallel combination.

20. The FACT of claim 18, in which: the DSBARs additionally comprise a fourth DSBAR and the first electrical circuit additionally connects the first FBAR of the fourth DSBAR in series with the first FBAR of the third DSBAR and the parallel combination.

21. The FACT of claim 12, in which: the first electrical circuit interconnects the first FBARs in a first circuit arrangement; and the second electrical circuit interconnects the second FBARs in a second circuit arrangement different from the first circuit arrangement.

22. The FACT of claim 12, in which the first electrical circuit connects the first FBARS of all the DSBARs in parallel.

23. The FACT of claim 12, in which the first electrical circuit connects the first FBARS of all the DSBARS in series.

24. The FACT of claim 12, in which the FBARs of one of the DSBARS differ in impedance from the FBARs of another of the DSBARs.

25. A film acoustically-coupled transformer (FACT), comprising: decoupled stacked bulk acoustic resonators (DSBARs), each of the DSBARs comprising: a first film bulk acoustic resonator (FBAR) and a second FBAR, one of the FBARs stacked on the other of the FBARs, each FBAR comprising opposed planar electrodes and a piezoelectric element between the electrodes, and an acoustic decoupler between the FBARs; a first electrical circuit interconnecting the first FBARs; and a second electrical circuit interconnecting the second FBARs; in which: the FACT has an impedance transformation ratio that differs from 1:1 and $1:m^2$, where m is the number of the DSBARS.

26. The FACT of claim 25, in which the FBARs of one of the DSBARs differ in impedance from the FBARs of another of the DSBARS.

27. The FACT of claim 25, in which: the DSBARS number more than two; the first electrical circuit interconnects the first FBARs in a first circuit arrangement comprising series and parallel connections among the first FBARs; and the second electrical circuit interconnects the second FBARs in a second circuit arrangement, different from the first circuit arrangement.

* * * * *

UNITED STATES PATENT AND TRADEMARK OFFICE
CERTIFICATE OF CORRECTION

PATENT NO. : 7,173,504 B2
APPLICATION NO. : 10/965474
DATED : February 6, 2007
INVENTOR(S) : John Larson It is certified that error appears in the above-identified patent and that said Letters Patent is hereby corrected as shown below:

Column 24 Line 66 in Claim 1, delete "(EBAR)" and insert -- (FBAR) --, therefor.

Column 25 Line 9 in Claim 2, delete "DSBARS" and insert -- DSBARs --, therefor.

Column 25 Line 10 in Claim 2, delete "DSBARS." and insert -- DSBARs. --, therefor.

Column 25 Line 15 in Claim 3, delete "DSBARS." and insert -- DSBARs. --, therefor.

Column 25 Line 16 in Claim 4, delete "piezo electric" and insert -- piezoelectric --, therefor.

Column 25 Line 25 in Claim 6, delete "DSBARS" and insert -- DSBARs --, therefor.

Column 25 Line 28 (Approx.) in Claim 7, delete "frequency," and insert -- frequency; --, therefor.

Column 25 Line 45 in Claim 10, delete "number" and insert -- number; --, therefor.

Column 25 Line 64, in Claim 12, delete "DSBARS." and insert -- DSBARs. --, therefor.

Column 26 Line 9 in Claim 15, delete "DSBAR" and insert -- DSBAR; --, therefor.

Column 26 Line 13 in Claim 16, delete "DSBARS" and insert -- DSBARs --, therefor.

Column 26 Line 20 in Claim 17, delete "DSBAR" and insert -- DSBAR; --, therefor.

Column 26 Line 26 in Claim 18, delete "DSBAR" and insert -- DSBAR; --, therefor.

Column 26 Line 32 in Claim 19, delete "DSBAR" and insert -- DSBAR; --, therefor.

Column 26 Line 38 in Claim 20, delete "DSBAR" and insert -- DSBAR; --, therefor.

Column 26 Line 48 in Claim 22, delete "FBARS" and insert -- FBARs --, therefor.

Column 26 Line 51 in Claim 23, delete "FBARS" and insert -- FBARs --, therefor.

Column 26 Line 51 in Claim 23, delete "DSBARS" and insert -- DSBARs --, therefor.

UNITED STATES PATENT AND TRADEMARK OFFICE
CERTIFICATE OF CORRECTION

PATENT NO. : 7,173,504 B2
APPLICATION NO. : 10/965474
DATED : February 6, 2007
INVENTOR(S) : John Larson It is certified that error appears in the above-identified patent and that said Letters Patent is hereby corrected as shown below:

Column 26 Line 54 in Claim 24, delete "DSBARS" and insert -- DSBARs --, therefor.

Column 26 Line 67 in Claim 25, delete "DSBARS." and insert -- DSBARs. --, therefor.

Column 27 Line 3 in Claim 26, delete "DSBARS." and insert -- DSBARs. --, therefor.

Column 27 Line 4 in Claim 27, delete "DSBARS" and insert -- DSBARs --, therefor.

Signed and Sealed this

Second Day of September, 2008

JON W. DUDAS
*Director of the United States Patent and Trademark Office*